US012382658B2

(12) United States Patent
Edwards et al.

(10) Patent No.: US 12,382,658 B2
(45) Date of Patent: Aug. 5, 2025

(54) REDUCING TRANSISTOR BREAKDOWN IN A POWER FET CURRENT SENSE STACK

(71) Applicant: Texas Instruments Incorporated, Dallas, TX (US)

(72) Inventors: Henry Litzmann Edwards, Garland, TX (US); Narayana Sateesh Pillai, Murphy, TX (US); Gangqiang Zhang, Plano, TX (US); Angelo William Pereira, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 17/682,370

(22) Filed: Feb. 28, 2022

(65) Prior Publication Data

US 2023/0006060 A1    Jan. 5, 2023

Related U.S. Application Data

(60) Provisional application No. 63/217,380, filed on Jul. 1, 2021.

(51) Int. Cl.
H10D 30/65    (2025.01)
H10D 30/01    (2025.01)

(52) U.S. Cl.
CPC ....... H10D 30/659 (2025.01); H10D 30/0281 (2025.01)

(58) Field of Classification Search
CPC .................. H01L 29/66681; H01L 29/7826
See application file for complete search history.

(56) References Cited

U.S. PATENT DOCUMENTS

| 7,787,226 B2 | 8/2010 | Sato |
| 10,937,905 B2 | 3/2021 | Zhang |
| 2003/0227070 A1 | 12/2003 | Efland |
| 2007/0230073 A1 | 10/2007 | Ker |
| 2017/0062608 A1* | 3/2017 | Mori .................. H01L 29/1083 |

FOREIGN PATENT DOCUMENTS

EP    3324439 B1    9/2020

OTHER PUBLICATIONS

J. Kraft, D. Kraft, B. Loeffler, H. Jauk and E. Wachmann, "Usage of HBTs beyond BVCEO", Proceedings of the Bipolar BiCMOS Circuits and Technology Meeting, 2005, pp. 33-36, doi: 10.1109/BIPOL.2005.1555195.
International Search Report for International Application No. PCT/US2022/035208, mailed Nov. 15, 2022, 5 pages.

* cited by examiner

Primary Examiner — Raj R Gupta
(74) Attorney, Agent, or Firm — Andrew R. Ralston; Frank D. Cimino

(57) ABSTRACT

An integrated circuit includes a first field effect transistor (FET) and a second FET formed in or over a semiconductor substrate and configured to selectively conduct a current between a first circuit node and a second circuit node. The first FET has a first source, a first drain and a first buried layer all having a first conductivity type, and a first gate between the first source and the first drain. The second FET has a second source, a second drain and a second buried layer all having the first conductivity type, and a second gate between the second source and the second drain. A first potential between the first source and the first buried layer is configurable independently from a second potential between the second source and the second buried layer.

20 Claims, 15 Drawing Sheets

REDUCING TRANSISTOR BREAKDOWN IN A POWER FET CURRENT SENSE STACK

CROSS-REFERENCE TO RELATED APPLICATIONS

This non-provisional application claims priority based upon U.S. provisional Application No. 63/217,380, filed Jul. 1, 2021, which is hereby incorporated by reference in its entirety.

BACKGROUND

In order to sense the current through a high voltage power field effect transistor (FET), a current sense circuit may contain small width current sense FETs arranged in a stack and may also contain a stack of spare current sense FETs arranged in parallel with the original stack to allow adjustments to be made if needed. Premature breakdown in the current sense FETs from parasitic bipolar junction transistors (BJTs) may cause destruction of the entire integrated circuit (IC) or may cause more subtle changes that can be harder to detect.

SUMMARY

In an integrated circuit that includes a power FET, a first current sense FET, and a second current sense FET, disclosed implementations control a potential between a source of the first current sense FET and an underlying buried layer, either statically or dynamically. These implementations may mitigate the possibility of turn-on of an associated parasitic transistor.

In one aspect, an implementation of an integrated circuit is disclosed. The integrated circuit includes a first field effect transistor (FET) and a second FET formed in or over a semiconductor substrate and configured to selectively conduct a current between a first circuit node and a second circuit node. The first FET has a first source, a first drain and a first buried layer all having a first conductivity type, and a first gate between the first source and the first drain. The second FET has a second source, a second drain and a second buried layer all having the first conductivity type, and a second gate between the second source and the second drain. A first potential between the first source and the first buried layer is configurable independently from a second potential between the second source and the second buried layer.

In another aspect, an implementation of a method of fabricating an integrated circuit is disclosed. The method includes forming a first FET and a second FET in or over a semiconductor substrate and also includes configuring the first and second FET to selectively conduct a current between a first circuit node and a second circuit node. The first FET has a first source, a first drain and a first buried layer all having a first conductivity type, and a first gate between the first source and the first drain. The second FET has a second source, a second drain and a second buried layer all having the first conductivity type, and a second gate between the second source and the second drain. The method configures the first source to receive a first potential with respect to the first buried layer and configures the second source to receive a difference second potential with respect to the second buried layer.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing figures in which:

DETAILED DESCRIPTION

Specific implementations will now be described in detail with reference to the accompanying figures. In the following detailed description, numerous specific details are set forth in order to provide a more thorough understanding. However, it will be apparent to one of ordinary skill in the art that implementations may be practiced without these specific details. In other instances, well-known features have not been described in detail to avoid unnecessarily complicating the description.

Various disclosed methods and devices of the present disclosure may be beneficially applied to switching DC-DC converters and other applications. While such implementations may be expected to provide improvements in performance and/or reliability, no particular result is a requirement unless explicitly recited in a particular claim.

In switching converters, both power FETs and current sense FETs, which may be laterally diffused metal oxide semiconductor (LDMOS) transistors, can experience high drain/source voltage $V_{DS}$ during each switching event. One example is a low side FET in a buck converter, which may have a sense FET that experiences a high drain/source voltage $V_{DS}$ stress when the low side power FET turns off and the high side power FET turns on. Such switching events may activate parasitic BJTs and trigger premature breakdown of either the main power FET or the small sense FETs. Various examples of the present application may reduce the incidence of such premature breakdown events of the sense FETs.

Figure 4:
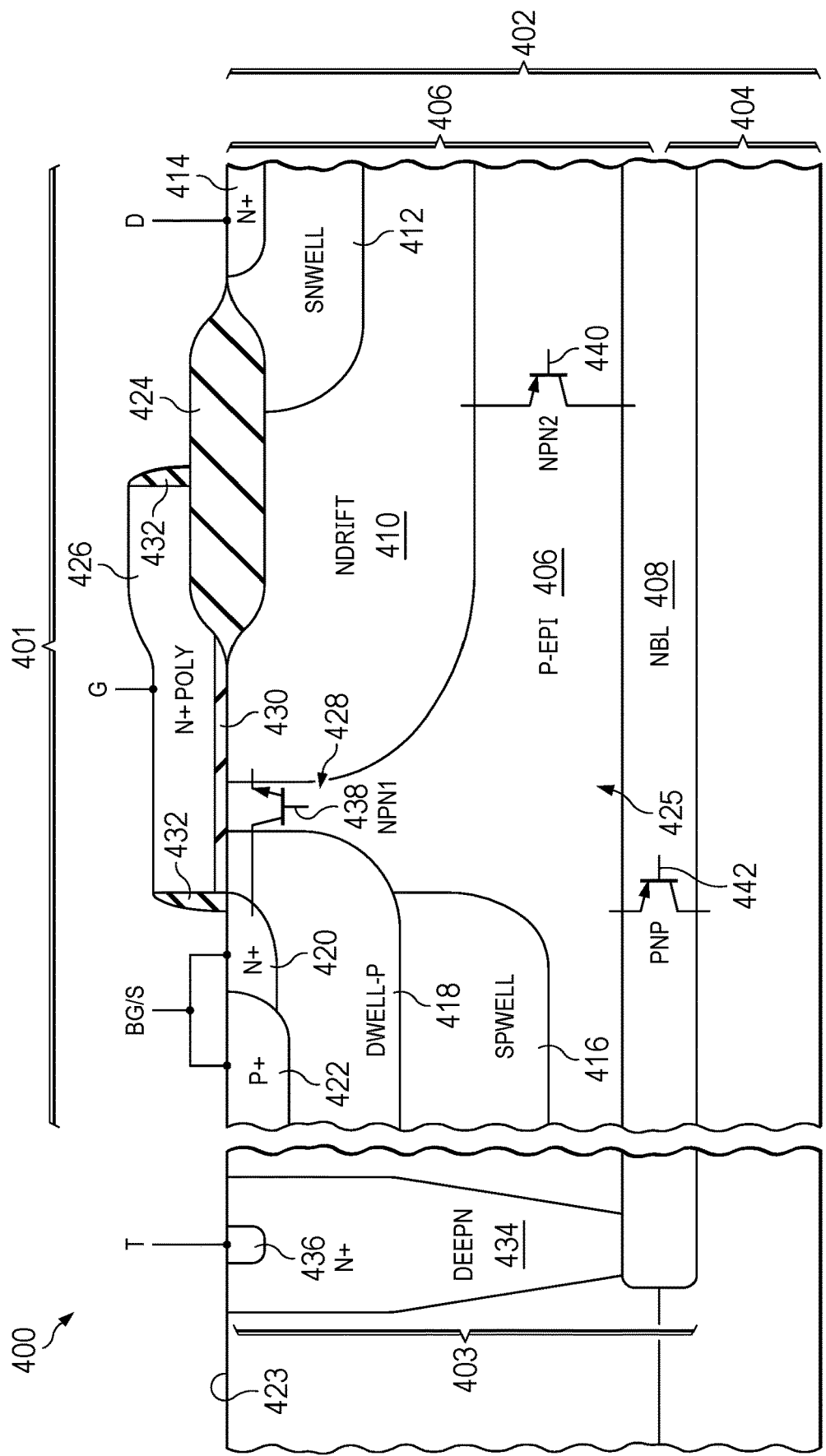
FIG. 4 depicts a cross-sectional view of an IC that includes an LDMOS transistor that has been formed in an isolation tank, illustrating parasitic transistors that may cause breakdown of the LDMOS transistor.

FIG. 4 depicts a cross-section of an integrated circuit 400 that contains an LDMOS transistor 401 and an isolation tank 403 that encloses the LDMOS transistor 401. Overlaid on the cross-section are schematic representations of several parasitic BJTs that may contribute to breakdown of the LDMOS transistor 401. The LDMOS transistor 401 is fabricated on a substrate 402, which in the implementation shown includes a P-type bulk silicon layer 404 and a P-type epitaxial layer 406. An N-type buried layer (NBL) 408 has been formed between the P-type bulk silicon layer 404 and the P-type epitaxial layer 406. An N-type drift region 410 within the P-type epitaxial layer 406 contains a shallow N-type well (SNWELL) 412 and an N-type drain region 414 within the SNWELL 412. Also lying within the P-type epitaxial layer 406 is a shallow P-type well (SPWELL) 416 and a P-type diffused well DWELL-P 418 over the SPWELL 416. The DWELL-P contains both an N-type source region 420 and a P-type integrated backgate contact region 422 to provide contact to a body region 425, which may be a portion of the P-type epitaxial layer 406.

At a first surface 423 of the substrate 402, a field relief oxide 424 has been grown over a portion of the N-type drift region 410 and the SNWELL 412. A polysilicon gate 426 lies over portions of the N-type source region 420, the N-type drift region 410 and a channel region 428 between the N-type source region 420 and the N-type drift region 410. The polysilicon gate 426 has also been extended over the field relief oxide 424 to provide a field plate. A gate dielectric 430, which may be a thermally-grown gate oxide, lies under the polysilicon gate 426 and dielectric sidewall spacers 432. The sidewall spacers 432, which may include a deposited silicon oxide, are adjacent or on the sidewalls of the polysilicon gate.

The N-type isolation tank 403 includes both the NBL 408 and a DEEPN region 434, which may also be referred to as an N-type sinker region 434. The N-type sinker region 434 extends from the first surface 423 and touches the NBL 408 and may also laterally surround the LDMOS transistor 401 to enclose and isolate a portion of the epitaxial layer 406 containing the LDMOS transistor 401. An isolation contact 436 to bias the N-type sinker region 434 and the NBL 408 may be formed in the N-type sinker region 434, e.g., by implanting N-type source/drain dopants. Although a single transistor is shown in the N-type isolation tank 403, one or more instances of the LDMOS transistor 401, or other transistors, may be formed within the N-type isolation tank 403. In the implementation shown, an electrode S connected to the N-type source region 420 and an electrode BG connected to the P-type integrated backgate contact region 422 are electrically connected together. An electrode G to the polysilicon gate 426, an electrode D to the N-type drain region 414, and an electrode T to the isolation tank 403 are also shown. The LDMOS transistor 401 and the isolation tank 403 in various baseline implementations generally operate without issue in typical operating regimes, but excursions from such typical operating regimes may result in undesirable operational issues and/or device failure.

In addition to the structures and regions that define the LDMOS transistor 401 and the isolation tank 403, three parasitic bipolar junction transistors are shown schematically in the LDMOS transistor 401. A first parasitic NPN transistor 438 has a collector provided by the N-type source region 420, an emitter provided by the N-type drift region 410, and a gate provided by the P-type body region 425. A second parasitic NPN transistor 440 has a collector provided by the N-type drift region 410, an emitter provided by the N-type buried layer 408, and a gate provided by the P-type body region 425. A parasitic PNP transistor 442 has a collector provided by the P-type bulk silicon layer 404, an emitter provided by the body region 425, and a base provided by the N-type buried layer 408. While all three parasitic transistors 438, 440, 442 may affect aspects of the operation of the LDMOS transistor 401 in some circumstances, without implied limitation some aspects of the present discussion address operational considerations with respect to the second parasitic NPN 440.

FIGS. 5, 5A, 5B and 5C illustrate various aspects of prior art LDMOS circuit configurations, and are referred to concurrently in the following discussion.

Figure 5A:
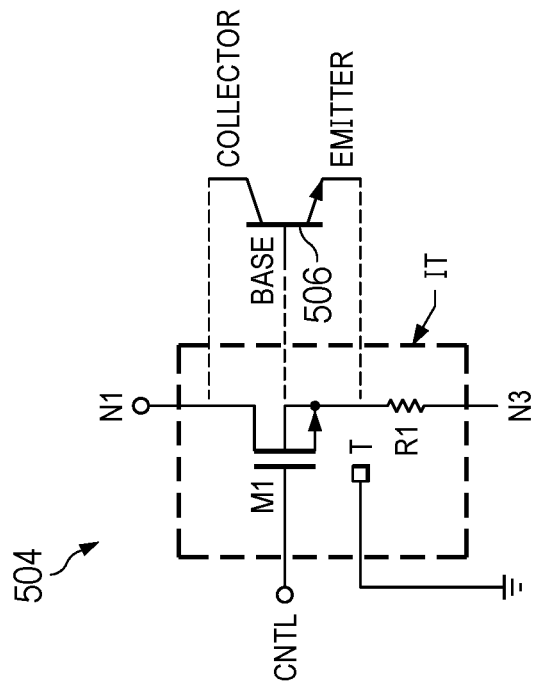
FIG. 5A depicts an equivalent circuit to the current sense stack of FIG. 5.
Figure 5:
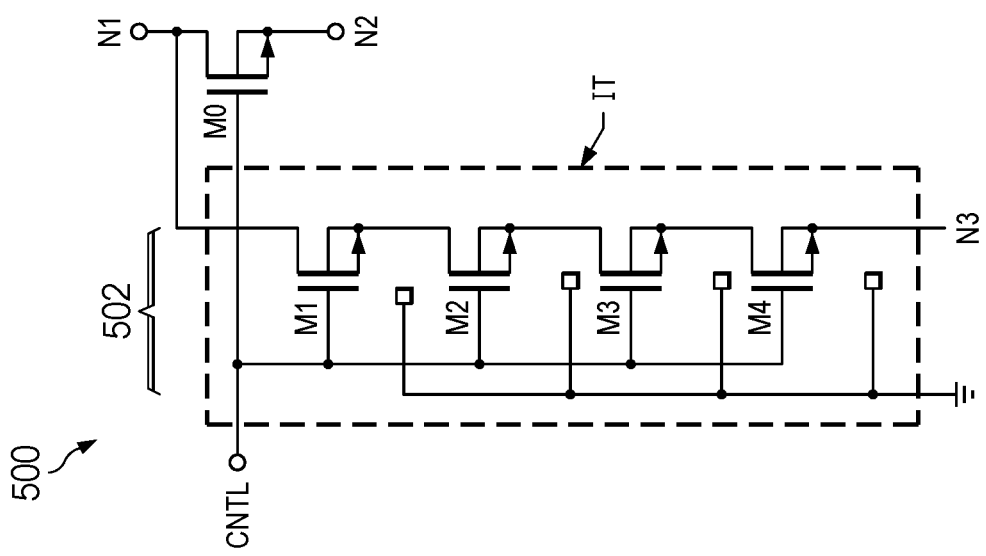
FIG. 5 depicts an IC having a power transistor and a current sense stack that can be used to sense the current through the power transistor according to a baseline implementation.

FIG. 5 depicts a depicts a schematic diagram of a baseline integrated circuit (IC) 500 that includes a power FET M0 and a current sense circuit 502 that includes a stack of current sense FETs M1-M4. The power FET M0 may be an LDMOS transistor having a large area and may handle a current on the order of amps, while the current sense FETs are typically much smaller and have higher resistance, typically carrying a current in the range of microamps to milliamps. The power FET M0 has a drain coupled to a first circuit node N1, a source coupled to a second circuit node N2, and a gate coupled to a control node CNTL. In the implementation shown, the current sense circuit 502 includes a first current sense FET M1 coupled between the first circuit node N1 and a third circuit node N3 in series with additional current sense FETs M2, M3, M4, although the number of additional current sense FETs may be higher or lower than the three shown. The FETs M1-M4 are shown as all located in a same isolation tank IT that represents the isolation tank 403 (FIG. 4). By serially connecting, or "stacking", several current sense FETs to the source of the first current sense FET M1, a sense current in the range of microamps may be used to monitor the large current, typically several amps, of the power FET M0 by a sense amplifier connected to the third circuit node N3. The drain of the first current sense FET M1 is coupled to the first circuit node N1 and the respective gates of the current sense FETs M1-M4 are coupled to the control node CNTL. The isolation tank is connected to the circuit ground node. In an example implementation of a buck converter, the power FET M0 may be implemented as the low-side power FET, so that the first circuit node N1 is a switch node SW, the second circuit node N2 is coupled to the ground node, and the control node CNTL is coupled to a control circuit (not shown) that drives the low-side power FET.

FIG. 5A schematically depicts an equivalent circuit 504 that may represent the current sense circuit 502 of FIG. 5. The circuit 504 includes the current sense FET M1 and a resistor R1 that is coupled in series with the source of the current sense FET M1 and represents the resistance provided by the transistors M2-M4. The isolation tank is shown connected to ground via the isolation node T. A transistor 506 represents a parasitic NPN transistor exemplified by the parasitic NPN transistor 440 that is formed in the current sense transistor M1. The transistor 506 has a collector formed by the drain of the current sense transistor M1, an emitter formed by the isolation tank, and a base formed by the body/source of the current sense transistor M1.

Figure 6:
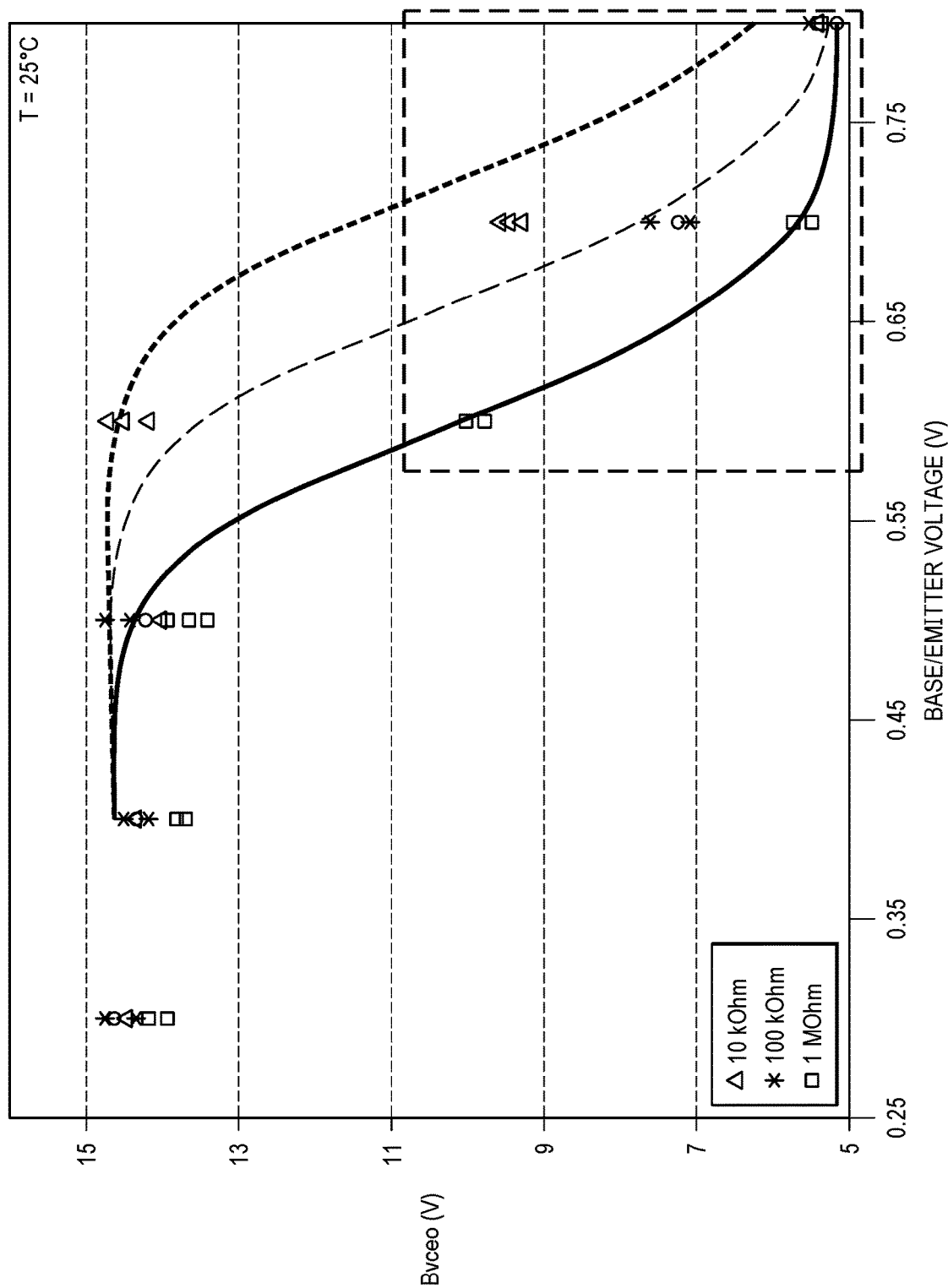
FIG. 6 depicts a series of graphs that chart the relationship between the base/emitter voltage and the collector/emitter breakdown voltage BVceo of an NPN transistor.

FIG. 6 provides a set of characteristics that shows the collector/emitter breakdown voltage BVceo of an NPN transistor as a function of the base/emitter voltage for each of three different resistance values between the base and the emitter of the NPN transistor. (See J. Kraft, D. Kraft, B. Loffler, H. Jauk and E. Wachmann, "Usage of HBTs beyond $BV_{CEO}$", Proceedings of the Bipolar/BiCMOS Circuits and Technology Meeting, 2005, 2005, pp. 33-36, doi: 10.1109/BIPOL.2005.1555195, incorporated by reference in its entirety.) As the characteristics demonstrate, the collector/emitter breakdown voltage BVceo of the subject NPN transistor, such as the parasitic NPN transistor 506, is high when the base-to-emitter voltage is low, but decreases as the base-to-emitter voltage increases. As the resistance on the source of the NPN transistor increases, the collector/emitter breakdown voltage BVceo may occur at a lower base/emitter voltage on the NPN transistor.

Relating this relationship back to the circuit 504 (FIG. 5A) and to the current sense circuit 502 (FIG. 5), the current sense circuit 502 may be used to measure the current through a low-side power FET. In such an implementation, a high base-to-emitter voltage may occur when the low-side power FET is turned off. The control node may go from about 5 V to about 0 V, turning off both the power FET M0 and the current sense FETs M1-M4. At the same time, the first circuit node N1 goes high and the drain voltage on the current sense FET M1 increases rapidly and is communicated to the collector of the parasitic NPN transistor 506. The grounded isolation tank acts as the emitter, so the parasitic NPN transistor 506 experiences a high collector/emitter voltage. The base of the parasitic NPN transistor 506 is the epitaxial layer in which the FET M1 is formed, e.g. the P-type epitaxial layer 406. When the current sense FETs M2-M4 turned off, these transistors now act as a high-value resistor, such as is shown as R1 in the circuit 504, while the high drain voltage on the first current sense FET M1 may cause a leakage current to occur. The leakage current through the equivalent high-value resistor R1 increases the voltage at the source of the FET M1, which increases the potential of the epitaxial layer and results in an increase of the base/emitter voltage of the parasitic NPN 506.

If the base/emitter voltage increases to a value greater than about 0.5 volts, the breakdown voltage of the LDMOS sense FET M1 across the P-type epitaxial layer can be decreased due to the NPN 506 turning on with a forward-biased base-emitter voltage and a reverse-biased collector-emitter voltage. The NPN action with this forward-biased base-emitter voltage changes the breakdown voltage from a BVdss mechanism (breakdown voltage drain-to-source with control terminal OFF) to a BVceo mechanism (breakdown voltage of collector-emitter with base terminal open or floating). The BVceo voltage depends on the base-to-emitter voltage, which contributes to the issue. Under normal circumstances, when the base-to-emitter voltage is less than about 0.25 V, the BVceo is greater than BVdss. If, at the same time, the collector/emitter voltage exceeds the now-lowered collector/emitter breakdown voltage BVceo of the parasitic transistor, a breakdown may occur. The higher the operating supply voltage and the greater the ratio between the size of the power FET and the size of the current sense FETs, the greater chance of damage to the current sense FETs, with the first current sense FET M1 typically being the failure point. A current that flows through the isolation tank may also damage the isolation tank. The damage induced thereby could result in a catastrophic hard circuit failure, or could instead result in a soft failure that renders the integrated circuit less effective or unpredictable. Thus, avoiding a failure through this mechanism is clearly desirable.

Figure 5C:
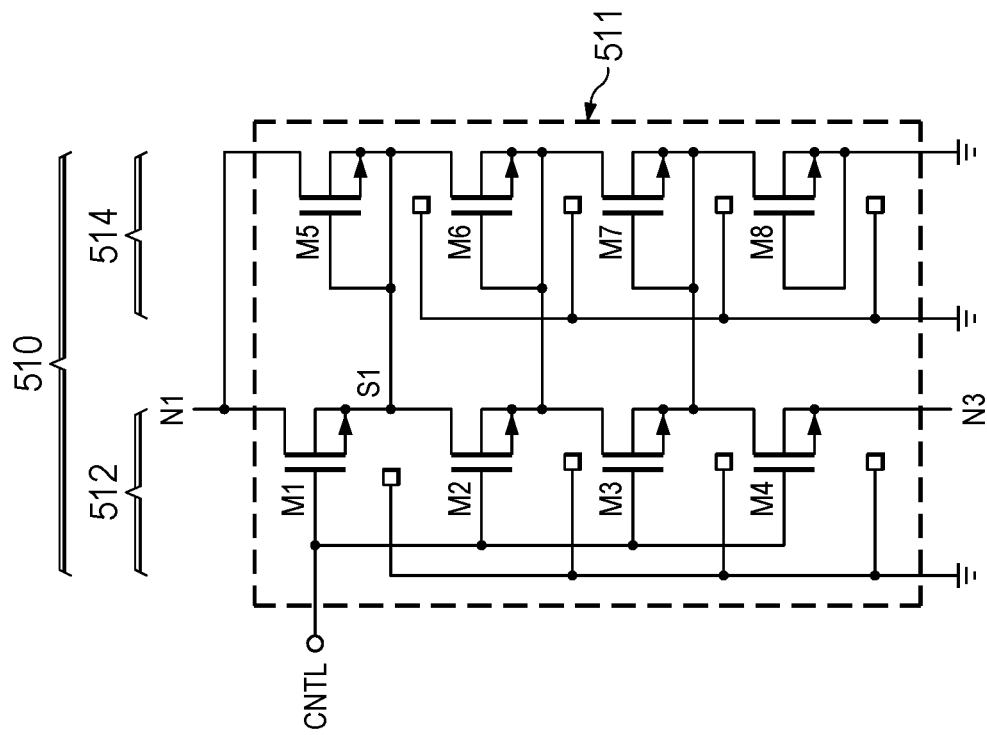
FIG. 5C depicts a current sense stack that includes spare current sense FETs according to a baseline implementation.
Figure 5B:
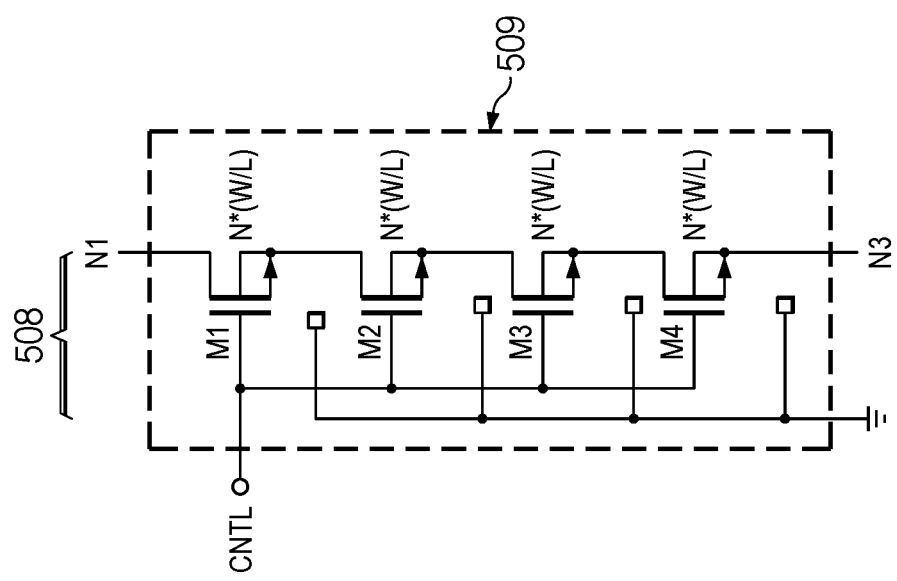
FIG. 5B depicts a current sense stack in which the current sense FETs contain multiple fingers according to a baseline implementation.

FIG. 5B depicts a current sense circuit 508, which is a variation on the baseline current sense circuit 502 is shown in FIG. 5. The current sense circuit 508 also contains a stack of the current sense FETs M1-M4, all located in a same isolation tank 509. In contrast to the current sense circuit 502, the current sense FETs M1-M4 of the current sense circuit 508 each have multiple fingers, shown by the notation N*(W/L), N>1, wherein a finger is a single instance of a parallel assembly of source, drain and gate. Thus each of the FETs M1-M4 includes at least two fingers, each having a width W and a length L, or a total width of N*W. The additional fingers may be added to increase the current-carrying capacity of the current sense FETs. However, in the situation above in which collector/emitter voltage breakdown BVceo may be triggered, the additional fingers may allow additional leakage current and may add to potential reliability and/or performance issues.

FIG. 5C depicts another baseline current sense circuit 610, which is an additional variation on the current sense circuit 502. A first stack 512 of the current sense FETs M1-M4 is coupled to a second stack 614 of current sense FETs M6-M8, with the second stack 514 initially disabled but able to be placed in service if needed; both the first stack 612 and the second stack 614 are located in an isolation tank 511. In the first stack 512, the first current sense FET M1 again has a drain coupled to the first circuit node N1, which is also coupled to the drain of the power FET (not shown). The gates of the current sense FETS M1. M4 are again coupled to the control node CNTL. Additionally, each current sense FET M5-M8 in the second stack 514 is coupled in parallel with a corresponding current sense FET in the first stack 512. For example, the drain and the source of the current sense FET M5 are connected respectively to the drain and the source of the current sense FET M1, the drain and the source of the current sense FET M6 are connected respectively to the drain and the source of the current sense FET M2, etc. The second stack 514 may provide increased current through the current sense circuit 610 as the circuit is refined. The configuration shown is an initial configuration in which the gate of each of the FETs M5-M8 is coupled to the source of the same FET, ensuring that the current sense FETs M5-M8 are not initially operable. If a need for any of the current sense FETs M5-M8 is determined, the gates of at least some of the current sense FETs M5-M8 may be connected to the control node CNTL by reconfiguring interconnections in a subsequent layout revision, thus activating the respective current sense FET and increasing the current through the current sense circuit 610 by an incremental amount.

In recognition of various described possible failure modes of the baseline circuit configurations, the inventors have identified a number of innovations that may be employed to reduce the occurrence of or prevent such failures. Various examples of the disclosure include circuit elements that provide a bias that limits the potential between the source and the isolation tank (or the buried layer portion of the isolation tank) of the top-most FET in a current-sensing FET stack when the FETs in the FET stack are in an off-state. In some examples such biasing may be steady-state (DC), while in other examples such biasing may be active only when the FETs of the FET stack are in an off-state. Such selective modulation of the source-isolation potential allows the FET stack to operate normally during the operating phase of the associated power FET while protecting the stacked FETs from breakdown during the off, or quiescent, phase of the power FET.

FIGS. 1A-1F illustrate examples that demonstrate principles of the disclosure that may reduce the likelihood of, or prevent, a failure in stacked FETs, e.g., of a switching converter sense circuit, due to exceeding the collector/emitter breakdown voltage BVceo of a parasitic bipolar transistor, and/or reduce the leakage current in such current sense circuits.

Figure 1B:
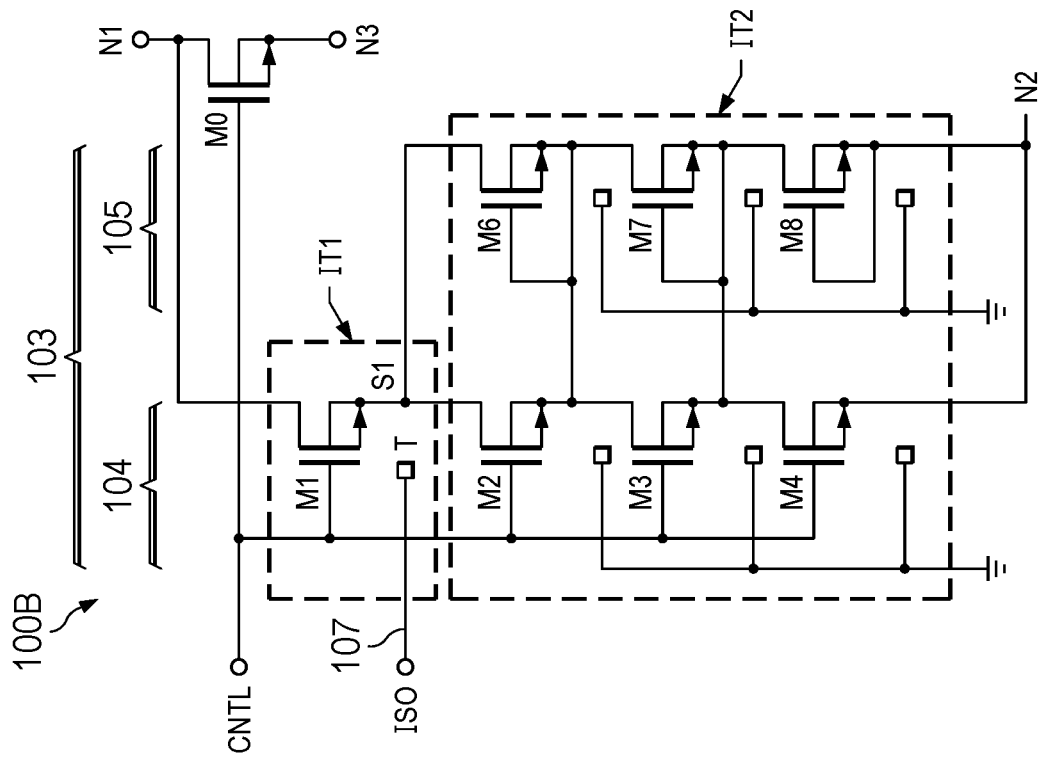
FIG. 1B depicts a schematic of an IC containing a power FET and a current sense stack having spare current sense FETs according to an implementation of the disclosure.
Figure 1A:
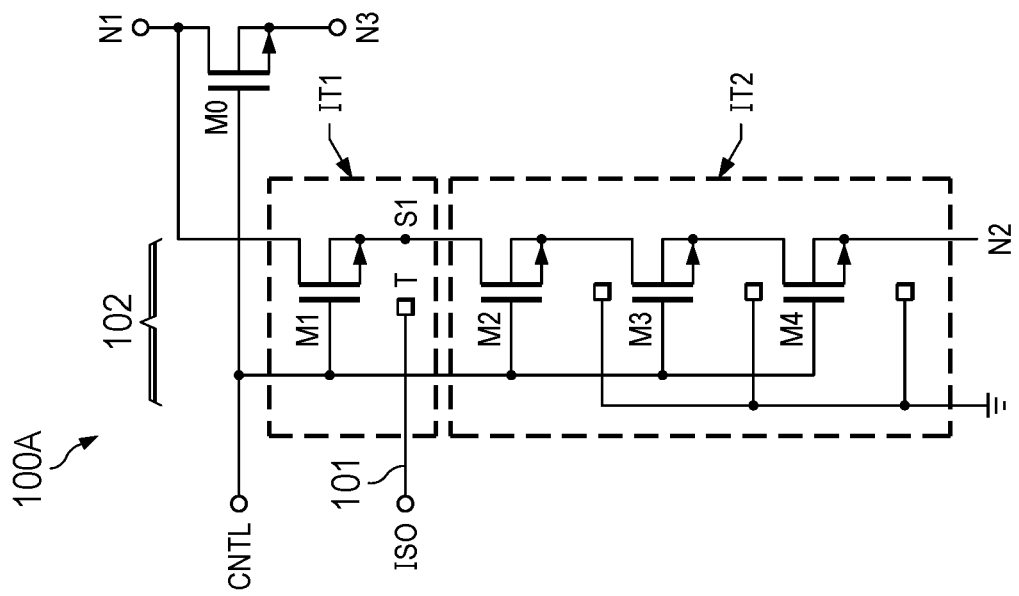
FIG. 1A depicts a schematic of an IC containing a power FET and a current sense stack according to an implementation of the disclosure.

FIG. 1A depicts an integrated circuit 100A that includes a power FET M0 and a switching converter current sense circuit 102 that is coupled to measure the current through the power FET M0. The current sense circuit 102 contains stacked current sense FETs M1-M4 that are connected in series between a first circuit node N1 and a sense amplifier circuit (not shown) coupled to a second circuit node N2. The power FET M0 has a drain coupled to the first circuit node N1, a source coupled to a third circuit node N3 and a gate coupled to a control node CNTL, which may be coupled to a control circuit for driving the power FET M0. (Throughout the disclosure the term "coupled" refers to a conductive electrical connection unless stated otherwise.) In this implementation, the current sense circuit 102 includes a first current sense FET M1 and three additional current sense FETs M2-M4, although the current sense circuit 102 may contain a greater number of current sense FETs. The gates of the current sense FETs M1-M4 are each coupled to the control node CNTL and a drain of the first current sense FET M1 is coupled to the first circuit node N1. Each of the transistors M0-M4 is formed in a same semiconductor substrate.

The FET M1 is located in a first isolation tank IT1 separate from a second isolation tank IT2 in which the FETs M2-M4 are located. In other words, the FET M1 is isolated from the transistors M0 and M2-M4 by an isolation structure such as an isolation tank that is located in the substrate between the FET M1 and the other transistors. Optionally the transistors M0 and M2-M4 may be located within a same isolation tank. A conductive path 101 electrically connects a circuit signal node ISO to a terminal T that is conductively connected to the isolation tank, e.g. an NBL and deep trench to the NBL. The ISO circuit signal node provides a signal to the terminal T that may also be referred to as ISO. The ISO signal may provide a voltage that is greater than the voltage at a source node S1 of the FET M1. (Throughout the disclosure all voltages are with respect to a same circuit ground reference.) The conductive path 101 may be considered and sometimes referred to as a breakdown protection circuit. By maintaining the voltage at the isolation tank IT1 greater than the voltage at the source node S1, the collector/emitter breakdown voltage $BV_{CEO}$ of the parasitic NPN transistor, e.g. the parasitic NPN transistor 440 (FIG. 4), will not be exceeded. Of course, the voltage at the source node S1 changes as the power FETs are switched, so a voltage on the circuit signal node ISO may be selected to be greater than the highest voltage that may be experienced on source node S1 during the time that the power FET M0 is turned off. In one implementation, the circuit signal node ISO can be coupled to a DC voltage source that provides, e.g., 1-4 V. In the implementation shown in IC 100A, the isolation tank IT2 is connected to a ground node. In some other examples, the isolation tank IT2 may also be connected to the circuit signal node ISO. In such examples the FETs M1-M4 may all be located in a same isolation tank connected to ISO.

FIG. 1B depicts an integrated circuit 100B containing a power FET M0 and a current sense circuit 103 that includes current sense FETS M1-M4 as well as spare current sense FETs M6-M8. Each of the current sense FETs M6-M8 is connected in parallel with a corresponding one of the main current sense FETs M2-M4. The power FET M0 again has a drain coupled to the first circuit node N1, a source coupled to the third circuit node N3 and a gate coupled to a control node CNTL, and provides a current path between N1 and N3. In the implementation shown, the current sense circuit 103 includes a first stack 104 of current sense FETs that are coupled in series and a second stack 105 of current sense FETs that serve as spares and are coupled in series with each other. As in the previous examples, the first stack 104 includes a first current sense FET M1 and three additional current sense FETs M2-M4, but in contrast to the baseline current sense circuit 510 of FIG. 5C, the second stack 105 does not contain a current sense FET coupled in parallel with the first current sense FET M1, e.g., the current sense FET M5 of FIG. 5C is omitted. The gates of each of the current sense FETs in the first stack 104, e.g., the current sense FETs M1-M4, are coupled to the control node CNTL, a source of the fourth current sense FET M4 is coupled to the second circuit node N2, and a drain of the first current sense FET M1 is coupled to the first circuit node N1. The second stack 105 contains current sense FETs M6-M8. The current sense FET M6 is coupled in parallel with the current sense FET M2, e.g. the M6 source is conductively connected to the M2 source, the M6 drain is conductively connected to the M2 drain and the M6 gate is conductively connected to the M2 gate. Similarly the current sense FET M7 is coupled in parallel with the current sense FET M3, and the current sense FET M8 is coupled in parallel with the current sense FET M4. As initially formed, each of current sense FETs M6-M8 is inactivated by coupling each gate to a respective source, e.g. by a fusible link. One or more of the FETs M6-M8 can be reconfigured to carry additional current if needed by breaking the connection between a desired source and drain. By eliminating the previously-used current sense FET M5, the current sense circuit 103 avoids additional leakage current from spare current sense FETs that might otherwise be present.

The FET M1 is isolated from the other FETs by isolation tank IT1. As illustrated, FETs M2-M8 are located in a same isolation tank IT2, though this feature is not a requirement. Optionally the FET M0 may also be located in isolation tank IT2. A conductive path 107 couples terminal T of the isolation tank IT1 to a circuit signal node ISO, which can be coupled to provide a voltage greater than the voltage at the source node S1. The conductive path 107 may be considered and referred to as a breakdown protection circuit. In one implementation (not shown), the isolation tank IT2 for the current sense FETs M2-M4 and current sense FETs M6-M8 may also be coupled to the circuit signal node ISO.

Figure 1D:
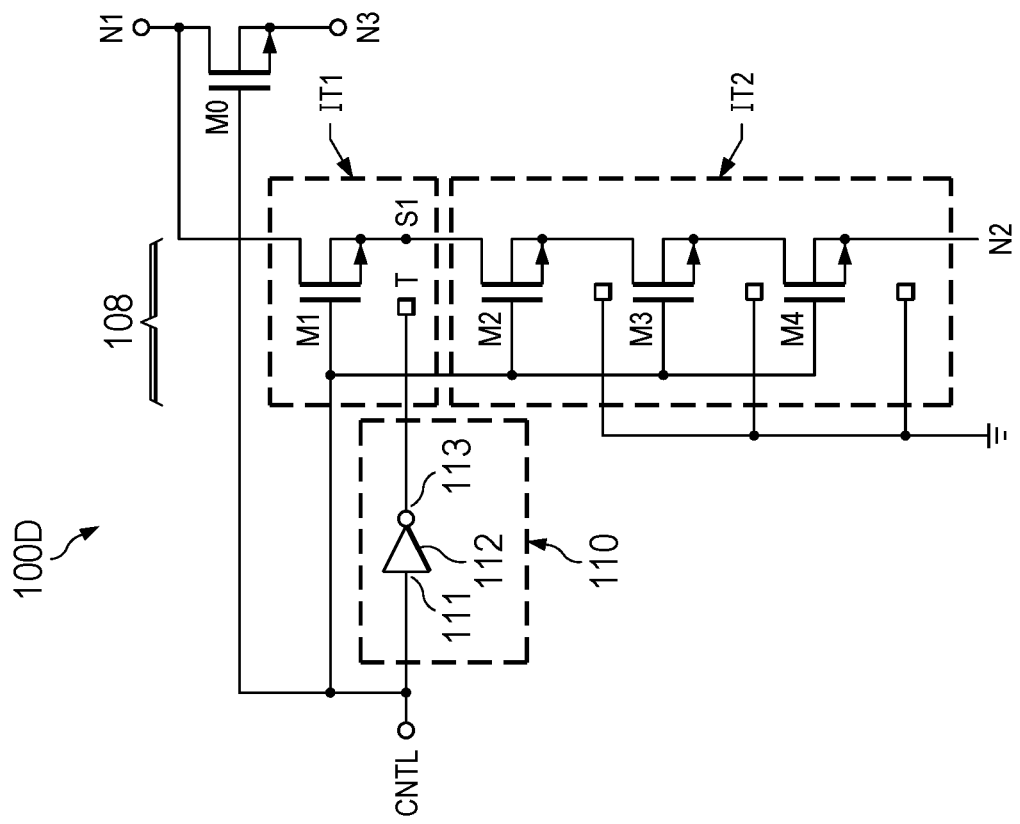
FIG. 1D illustrates a schematic of an IC containing a power FET and a current sense stack in which the voltage on the isolation for the first current sense FET is coupled to a dynamic value according to an implementation of the disclosure.
Figure 1C:
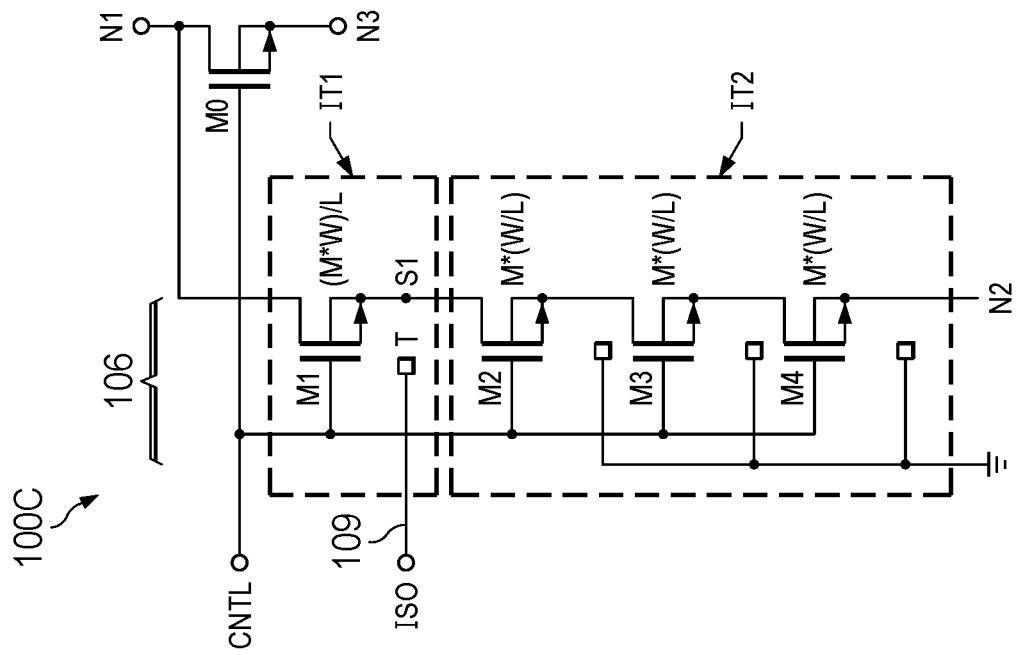
FIG. 1C depicts a schematic of an IC containing a power FET and a current sense stack in which multiple fingers in a first current sense FET have been combined into a single finger according to an implementation of the disclosure.

FIG. 1C depicts an integrated circuit 100C containing a power FET M0 and a current sense circuit 106 that includes multiple fingers for one or more of the FETs M2-M4. In some other examples, the current sense FETs may each have as few as a single finger. The example of the IC 100C is presented as an improvement over the baseline current sense circuit 508 (FIG. 5B). The power FET M0 again has a drain coupled to the first circuit node N1, a source coupled to the third circuit node N3 and a gate coupled to a control node CNTL. In the implementation of the current sense circuit 508 (FIG. 5B), each of the current sense FETs included N fingers, each finger having a width W and a length L. In the current sense circuit 106, the FET M1 has a single finger with width M*W. (See FIG. 5B.) Each of the FETs M2-M4 includes M fingers with width W, M>1, for a total area M*(W/L). By eliminating the multiple fingers in the current sense FET M1, the current sense circuit 106 avoids additional leakage current from multiple fingers that might otherwise be present. The drain of the first current sense FET M1 is coupled to the first circuit node N1; the gates of the current sense FETs M1-M4 are each coupled to the control node CNTL, and the source of the fourth current sense FET M4 is coupled to the second circuit node N2. The isolation tank IT2 is grounded and contains FETs M2-M4. A conductive path 109 couples the isolation tank IT1 for the current sense FET M1, to the circuit signal node ISO. As described previously the circuit signal node ISO can be coupled, e.g., to an available local voltage supply that will maintain the voltage on the circuit signal node ISO at a value above the voltage at the source node S1. The conductive path 109 may be considered and referred to as a breakdown protection circuit.

FIG. 1D depicts an integrated circuit 100D containing a power FET M0, a current sense circuit 108, and a breakdown protection circuit 110 that dynamically biases the isolation tank IT1. As in previous implementations, the power FET M0 has a drain coupled to the first circuit node N1, a source coupled to the third circuit node N3 and a gate coupled to a control node CNTL. The current sense circuit 108 includes a first current sense FET M1 and three additional current sense FETs M2-M4 connected in series, though fewer or more than two additional current sense FETs may be used. The breakdown protection circuit 110 receives the CNTL signal at an input 111 of an inverter 112. The gates of M0-M3 receive a non-inverted sense of CNTL, and the inverter 112 directs an inverted sense of CNTL ( ) from an output 113 to the terminal T of the isolation tank IT1. The FETs M2-M4 are located in isolation tank IT2, thus a substrate isolation structure is located between the FETs M1 and M2, between M1 and M3, and between M1 and M4. Optionally the FET M0 is located in a same isolation tank as the FETs M2-M4. The CNTL signal may be a square wave in various examples. When CNTL is high (TRUE), the power FET M0 and the first current sense FET M1 are turned on. The source of the current sense FET M1 is therefore coupled to ground through the power FET M0, while the isolation tank IT1 is held low by $\overline{\text{CNTL}}$. In this condition the breakdown condition of the parasitic NPN transistor is not met. When CNTL is low (FALSE), the power FET M0 and the current sense FETs M1-M4 are off, so the voltage at the source node S1 may be determined by other devices connected to the first circuit node N1. The first circuit node N1 may have a positive switching voltage of about 20 volts that may be briefly exceeded by several volts by switching transients. Leakage current through M2-M4 may increase the voltage at the source node S1 as previously described, increasing the voltage at the parasitic NPN base (exemplified by the P-type epitaxial layer 406 shown in FIG. 4), thereby decreasing the breakdown margin of the parasitic NPN. However, the node T of the isolation tank IT1 receives a logical high signal from the inverter 112, thereby decreasing the base-to-emitter voltage of the parasitic NPN and increasing the collector/emitter breakdown voltage BVceo and protecting the FET M1 from breakdown.

Figure 1F:
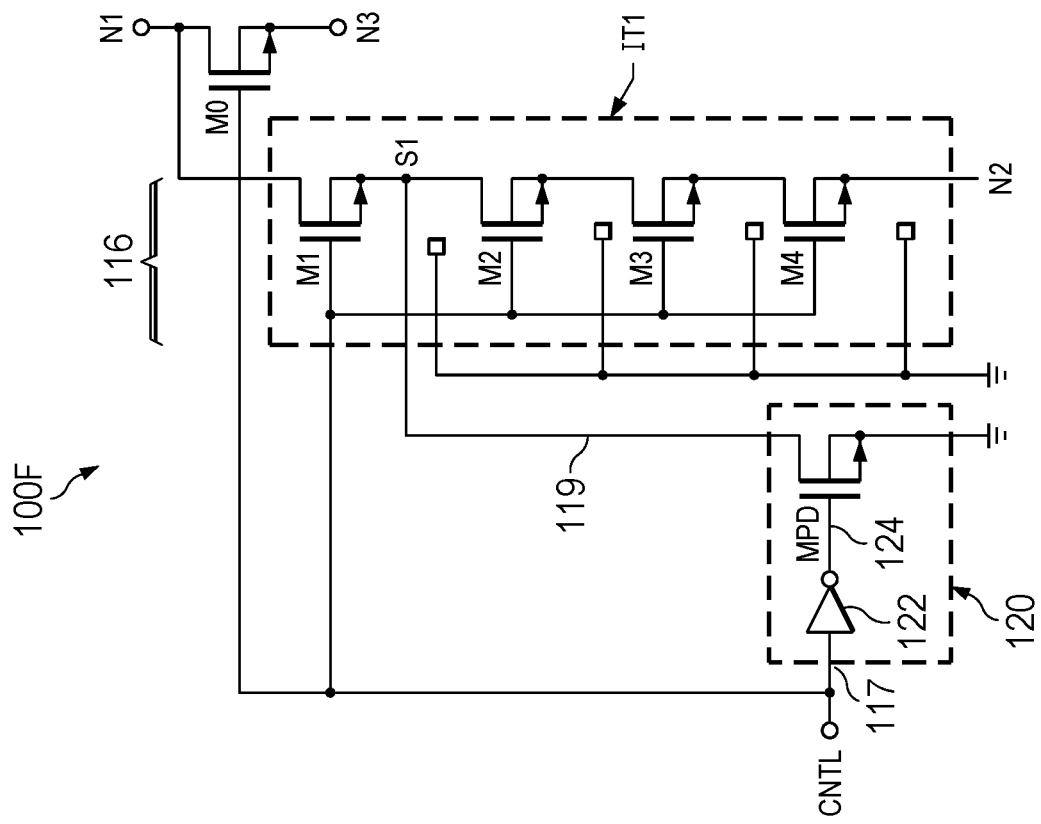
FIG. 1F illustrates a schematic of an IC containing a power FET and a current sense stack in which the source of the first current sense FET is coupled to a dynamic value according to an implementation of the disclosure.
Figure 1E:
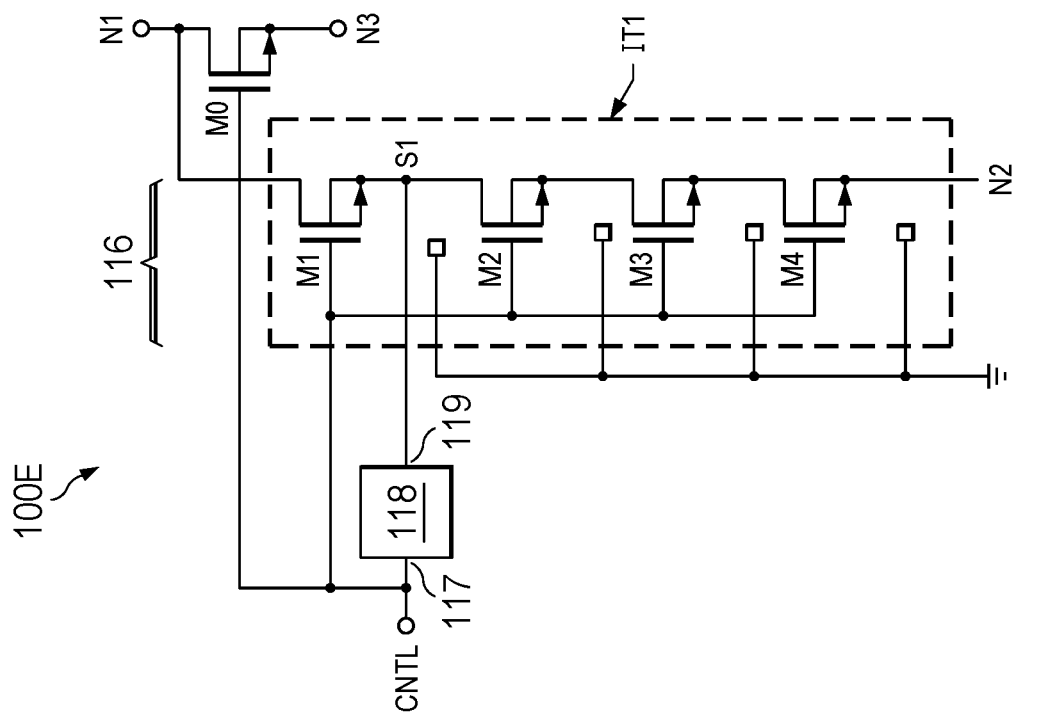
FIG. 1E illustrates a schematic of an IC containing a power FET and a current sense stack in which the source of the first current sense FET is coupled to a dynamic value according to an implementation of the disclosure.

FIG. 1E depicts an integrated circuit 100E containing a power FET M0, a current sense circuit 116, and a breakdown protection circuit 118 that provides a variation of dynamic breakdown protection in which the voltage at the source node S1 is dynamically modulated. Once again, the power FET M0 has a drain coupled to the first circuit node N1, a source coupled to the third circuit node N3 and a gate coupled to a control node CNTL. The current sense circuit 116 includes a stack of current sense FETs that includes a first current sense FET M1 and at least one additional current sense FETs, e.g. M2, M3, M4, electrically connected in series to provide a current path between the first circuit node N1 and the second circuit node N2. In the current sense circuit 116, a drain of the first current sense FET M1 is electrically connected to the first circuit node N1, a source of the fourth current sense FET M4 is electrically connected to the second circuit node N2, the gates of each of the current sense FETs are electrically connected to the control node CNTL, and an isolation tank IT1 is electrically connected to a reference voltage node of the circuit, e.g. a ground node. Each of the FETs M1-M4 are located in the isolation tank IT1, which may optionally include the FET M0. Thus each of the FETs M1-M4 includes a buried layer that is a portion of a same buried layer, e.g. the NBL 408. The breakdown protection circuit 118 includes any number of circuit elements that implement a function such that when the control node CNTL has a logical high value, the voltage of the source node S1 is unconstrained by the breakdown protection circuit 118. And when the control node CNTL has a logical low value, the source node S1 is constrained to a value that reduces the chance of breakdown of the parasitic NPN exemplified by the parasitic NPN transistor 440 (FIG. 4). The breakdown protection circuit 118 has an input 117 electrically connected to the control node CNTL and an output 119 electrically connected to the source node S1. When the control node CNTL has a high value, the output 119 may have high resistance (e.g. greater than 1 MΩ) so that the source node S1 is unconstrained by the breakdown protection circuit 118. But when the control node CNTL has a low value, the output 119 may provide a low output value, or may actively pull the source node S1 down to the ground reference of the circuit.

FIG. 1F illustrates a more specific example implementation of the breakdown protection circuit 118. An integrated circuit 100F contains the power FET M0, the current sense circuit 116, and a source pull-down circuit 120. The IC 100F may be otherwise identical to the IC 100E with the exception of the source pull-down circuit 120. The source pull-down circuit 120 contains an inverter 122 and a pull-down FET MPD. The FET MPD has a drain coupled to the source node S1 of the first current sense FET M1 and a source coupled to a circuit power node that is grounded. The FET MPD is shown as an NMOS FET without implied limitation. An input 117 to the source pull-down circuit 120 may be referred to as a protection circuit input, and is electrically connected to the control node CNTL. An inverter output 124 is coupled to a gate of the pull-down FET MPD. When the control node CNTL is in a logical high state the gates of power FET M0 and the current sense FETs M1-M4 are turned on, the pull-down FET MPD is turned off (e.g. having a high resistance greater than 1 MΩ) such that the source node S1 is unaffected by the source pull-down circuit 120. When the control node CNTL is in a logical low state the gates of the power FET M0 and the current sense FETs M1-M4 are turned off. The pull-down FET MPD is turned on (e.g. having a low resistance less than 100Ω) and the source node S1 is pulled to a value near the ground node, a condition referred to without implied limitation as "grounded". Thus the pull-down FET MPD is one example that provides between the source node S1 and a circuit power node a current path configured to have a high resistance in the event that the FET M1 is on, and configured to have a low resistance in the event that the FET M1 is off. When the FET MPD is on the voltage on the source node S1 is about equal to the voltage on the isolation tank IT1, which is directly tied to ground. In this condition, leakage current through the FETs M2-M4 that might otherwise increase the voltage of the source node is substantially prevented. Thus the previously described condition in which the breakdown voltage of the parasitic NPN 440 is avoided. The example of FIG. 1F may be advantageous relative to other examples in that FETs M0-M4 may all be located in a single isolation tank, thereby minimizing die area committed to the isolation structures.

An alternative example, not shown, of the source pull-down circuit 120 may implement the FET MPD using a PMOS FET. The gate of the PMOS FET is coupled to the control node CNTL, the source is coupled to the source node S1, and the drain is coupled to the ground node. This example may provide the ability to eliminate the inverter 122, since the PMOS FET provides an effective inversion of the CNTL state. Of course other functions may be included with the PMOS FET in similar examples, such as a non-inverting buffer between the PMOS FET and the CNTL node. One skilled in the art will recognize that numerous other implementations are possible.

Figure 2:
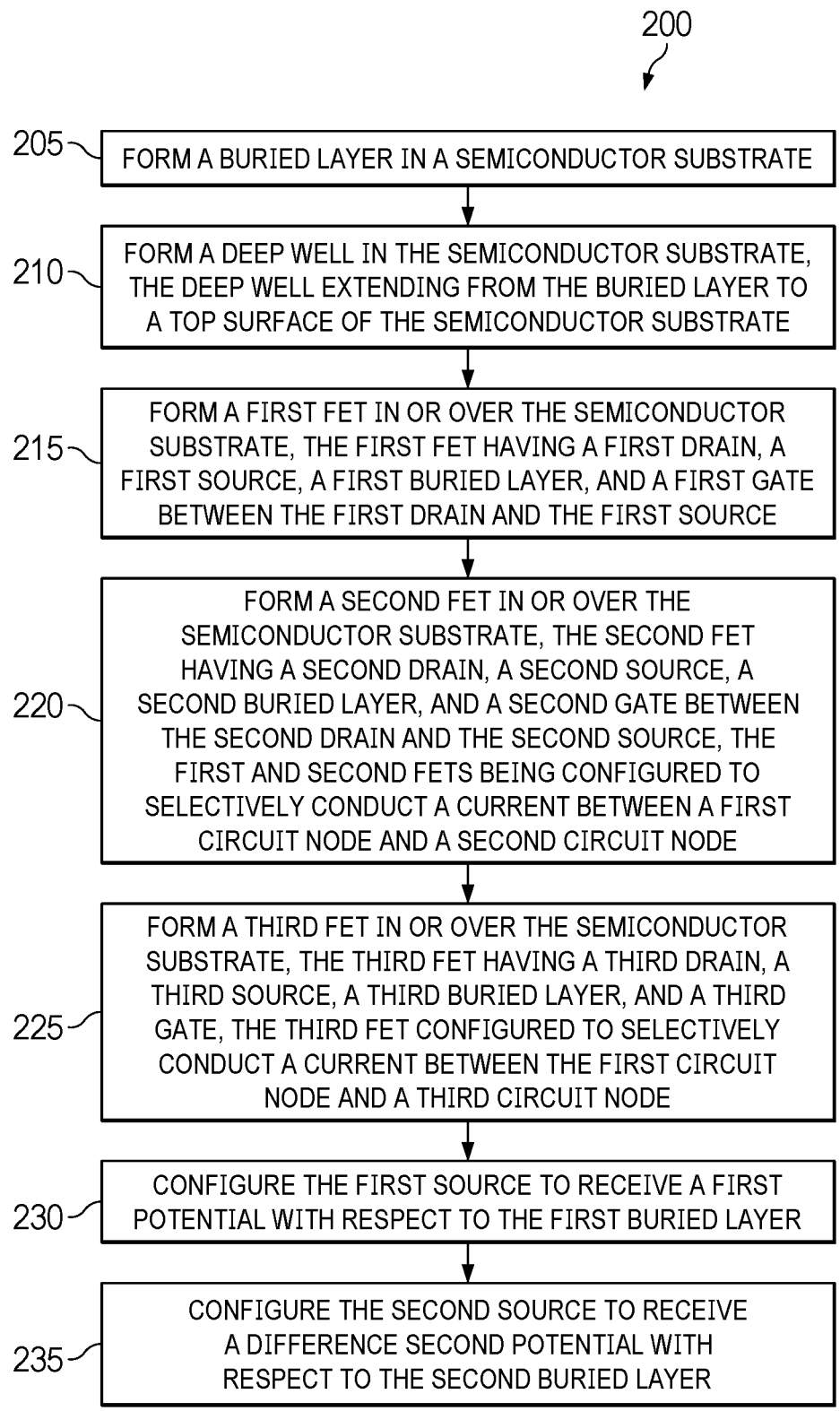
FIG. 2 depicts a method of fabricating an IC having a current sense stack according to an implementation of the disclosure.

FIG. 2 depicts a flowchart of a method 200 of fabricating an IC that contains a power FET, current sense FETs that are coupled to detect the current flowing through the power FET, and one or more isolation tanks that enclose one or more of the FETs. The method 200 is discussed in conjunction with FIGS. 3A-3G, which depict in cross-sections, various stages in the fabrication of the IC to produce an N-channel FET, which may be an LDMOS transistor. In other implementations, a P-channel FET may be fabricated using opposite dopant implantation steps and materials. The method 200 begins with forming a buried layer in a semiconductor substrate (205) and with forming a deep well in the semiconductor substrate, the deep well extending from the buried layer to a top surface of the semiconductor substrate (210) to form an isolation tank. The fabrication of the one or more isolation tanks may be conventional or may be formed by a future-developed process.

Figure 3A:
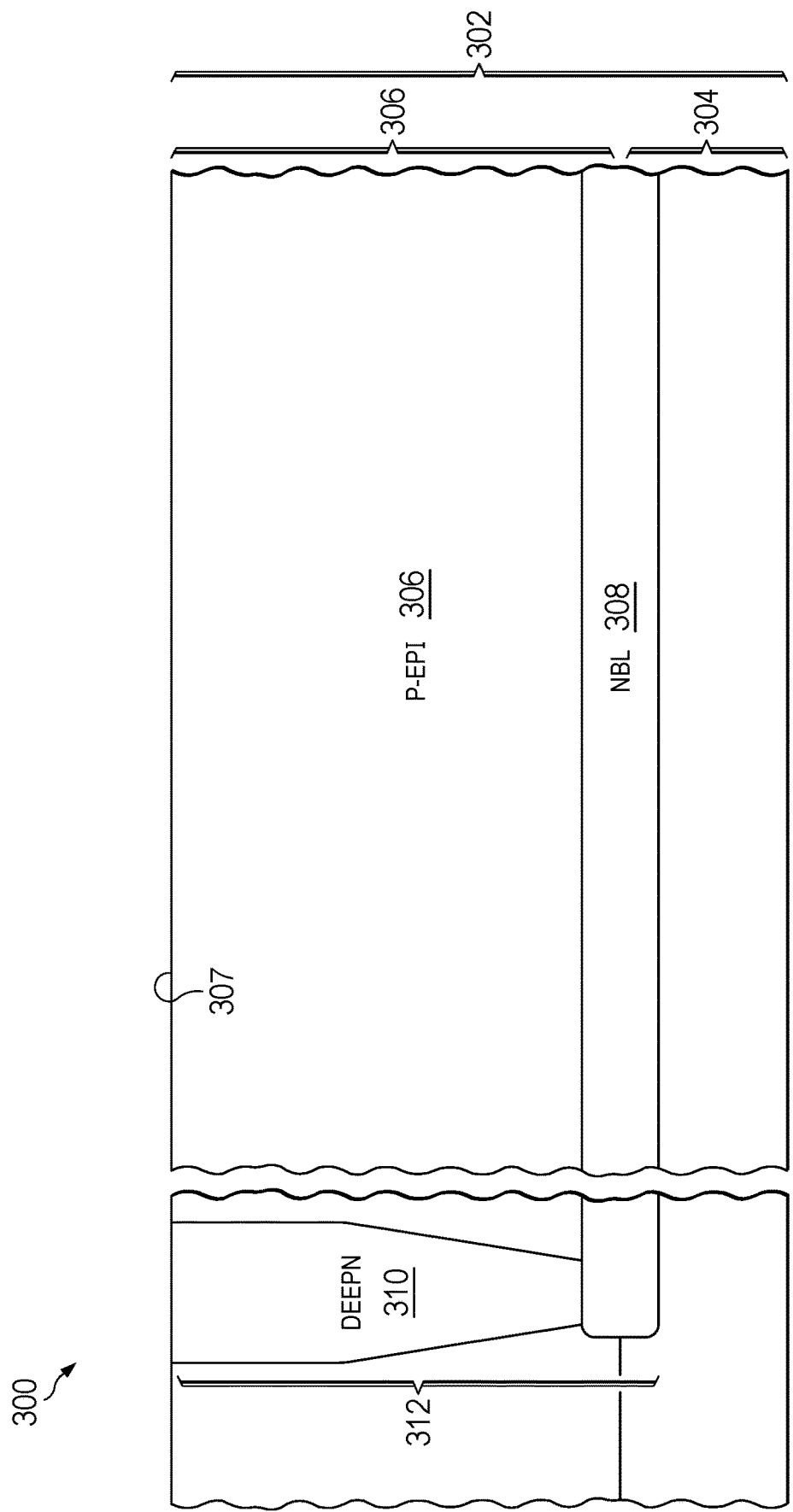
FIGS. 3A-3G depict cross-sections of an IC at various stages during the fabrication of a FET and an isolation tank containing the FET according to an implementation of the disclosure.

FIG. 3A illustrates an integrated circuit 300 containing a semiconductor substrate 302, which in one implementation may include a P-type bulk silicon 304 on which a P-type epitaxial layer 306 has been grown or deposited. Prior to forming the epitaxial layer 306, a hard mask (not shown) may be deposited, patterned, and etched to expose desired locations for the N-type buried layer, and an N-type dopant (not shown) is implanted to a first surface 307 of the semiconductor substrate 302. In one implementation, the N-type dopant may be antimony or other N-type dopant. As the epitaxial layer 306 is formed, the N-type dopant diffuses into both the bulk silicon 304 and the epitaxial layer 306 to form an NBL 308.

Once the epitaxial layer 306 is formed, a mask (not shown) is again deposited, patterned, and etched to expose desired locations of an N-type deep well (DEEPN) 310, also known as a DEEPN sinker region 310. An N-type dopant (not shown) is implanted into the semiconductor substrate 302. After removal of the mask, a thermal process may be used to diffuse the N-type dopant to form the DEEPN sinker region 310, which extends from the first surface 307 to the NBL 308 and also extends along the periphery of the NBL 308 to form the isolation tank 312. In one implementation, the DEEPN sinker region 310 may be N+; in one implementation, the DEEPN sinker region 310 may be N−.

In one implementation, rather than forming a DEEPN sinker region 310, a deep trench (not shown) may be formed, e.g., by deposition, patterning, and etching of a hardmask (not shown) that exposes a region for a desired deep trench. The deep trench is then etched through the semiconductor substrate 302 to a depth that intersects the NBL 308. N-type dopants may then be implanted into the substrate along sidewalls of the deep trench down to the NBL 308. The N-type dopants may include phosphorus and arsenic, and may be implanted in several steps at tilt angles of 20 degrees to 30 degrees from a vertical axis perpendicular to the first surface 307 of the semiconductor substrate 302. In one implementation, the N-type dopants may be implanted at a total dose of $3 \times 10^{14}$ cm$^{-2}$ to $3 \times 10^{15}$ cm$^{-2}$, for example, to attain a desired conductivity in subsequently-formed vertical N-type regions (not shown). Although only a single isolation tank 312 is shown, multiple isolation tanks may be formed in order to isolate one or more FETs in each isolation tank.

Returning to FIG. 2, the method 200 continues with forming a first FET in or over the semiconductor substrate, the first FET having a first drain, a first source, a first buried layer, and a first gate between the first drain and the first source (215). The method forms a second FET in or over the semiconductor substrate, the second FET having a second drain, a second source, a second buried layer, and a second gate between the second drain and the second source (220). The first and second FETs, which may be LDMOS transistors, are configured to selectively conduct a current between a first circuit node, e.g., N1 (FIG. 1A) and a second circuit node, e.g., N2 (FIG. 1A). The method also forms a third FET in or over the semiconductor substrate, the third FET having a third drain, a third source, a third buried layer, and a third gate (225). The third FET may be a power FET and may be configured to selectively conduct a current between the first circuit node and a third circuit node. In one embodiment, the third drain may be electrically connected to the second drain and the third source may be electrically connected to the second source and to the third gate.

FIGS. 3B-3F together depict an example process of forming a FET 301 within the isolation tank 312 previously formed. Although a single FET 301 is shown for simplicity, each of the current sense FETs and the power FET may be formed in a similar manner. In one implementation, the first FET, e.g., M1 (FIG. 1A) may be formed in a first isolation tank, e.g., IT1 (FIG. 1A) and the second FET, e.g., M2 (FIG. 1A) may be formed in a second isolation tank, e.g., IT2 (FIG. 1A). In one implementation, the first FET, e.g., M1 (FIG. 1E) and the second FET, e.g., M2 (FIG. 1E) may both be formed in a first isolation tank, e.g., IT1 (FIG. 1E).

Figure 3B:
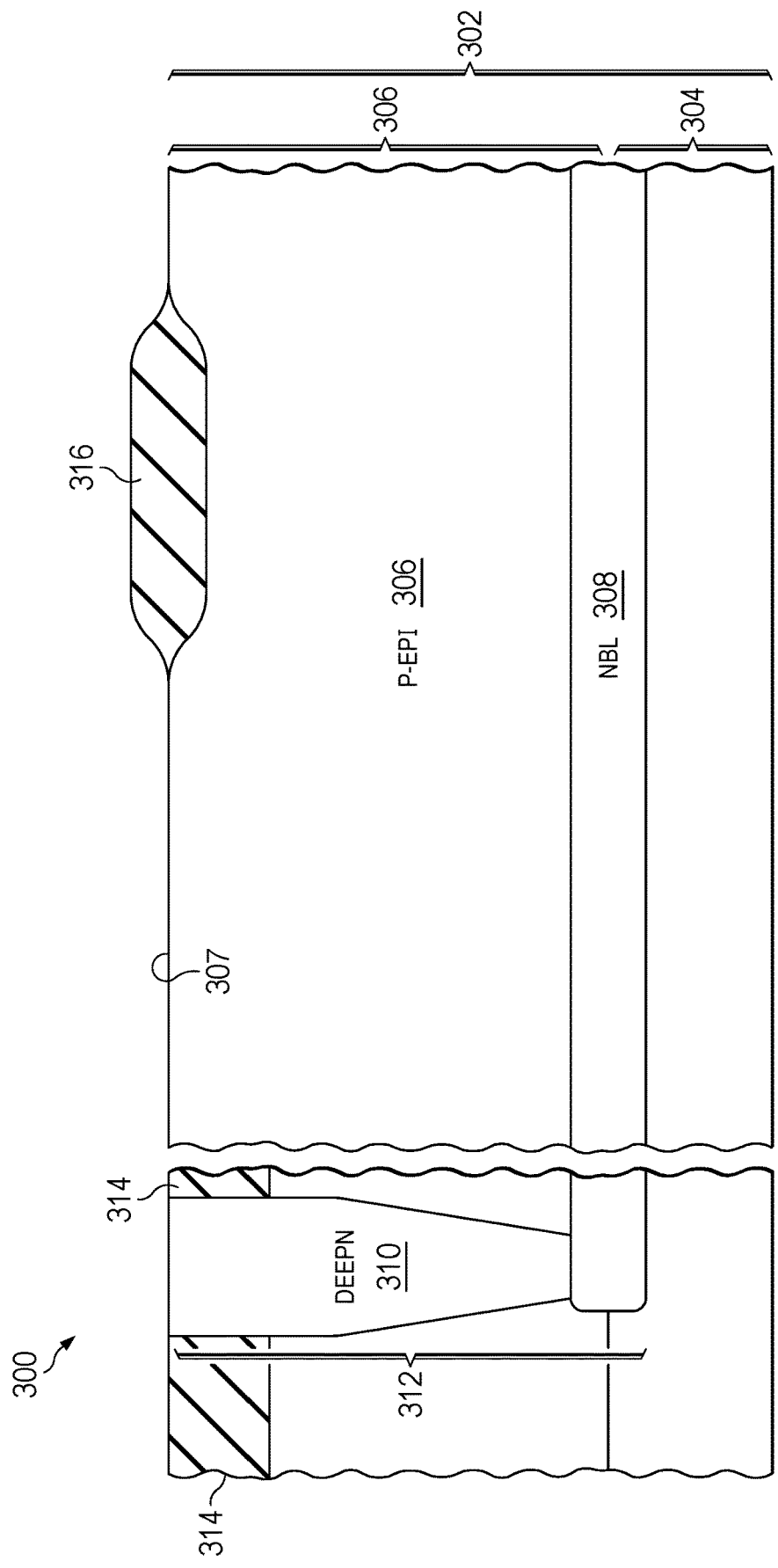

FIG. 3B depicts the integrated circuit 300 after the formation of isolation structures, which may include both shallow trench isolation (STI) structures 314 and local oxidation of silicon (LOCOS) structures 316. In the implementation shown, the STI structures 314 may be located outside of the isolation tank 312 and also between the DEEPN sinker region 310 and the active area of the FETs, while the LOCOS structures 316 may be located over the planned drain regions. The STI structures 314 may be formed by depositing and patterning an STI mask (not shown) to expose the regions of the semiconductor substrate 302 where STI structures are desired. The exposed regions of the semiconductor substrate 302 are then etched to a desired depth. After removal of the STI mask, a layer of oxide may be deposited to fill and overfill the trenches formed by the etching process. Excess oxide may be removed, e.g., by chemical-mechanical processing to provide a planar surface. A LOCOS mask (not shown) is then deposited and patterned to expose regions of the first surface 307 where the LOCOS structures are desired. Field oxidation is then performed to grow the LOCOS structures 316, following which the LOCOS mask is removed.

Figure 3C:
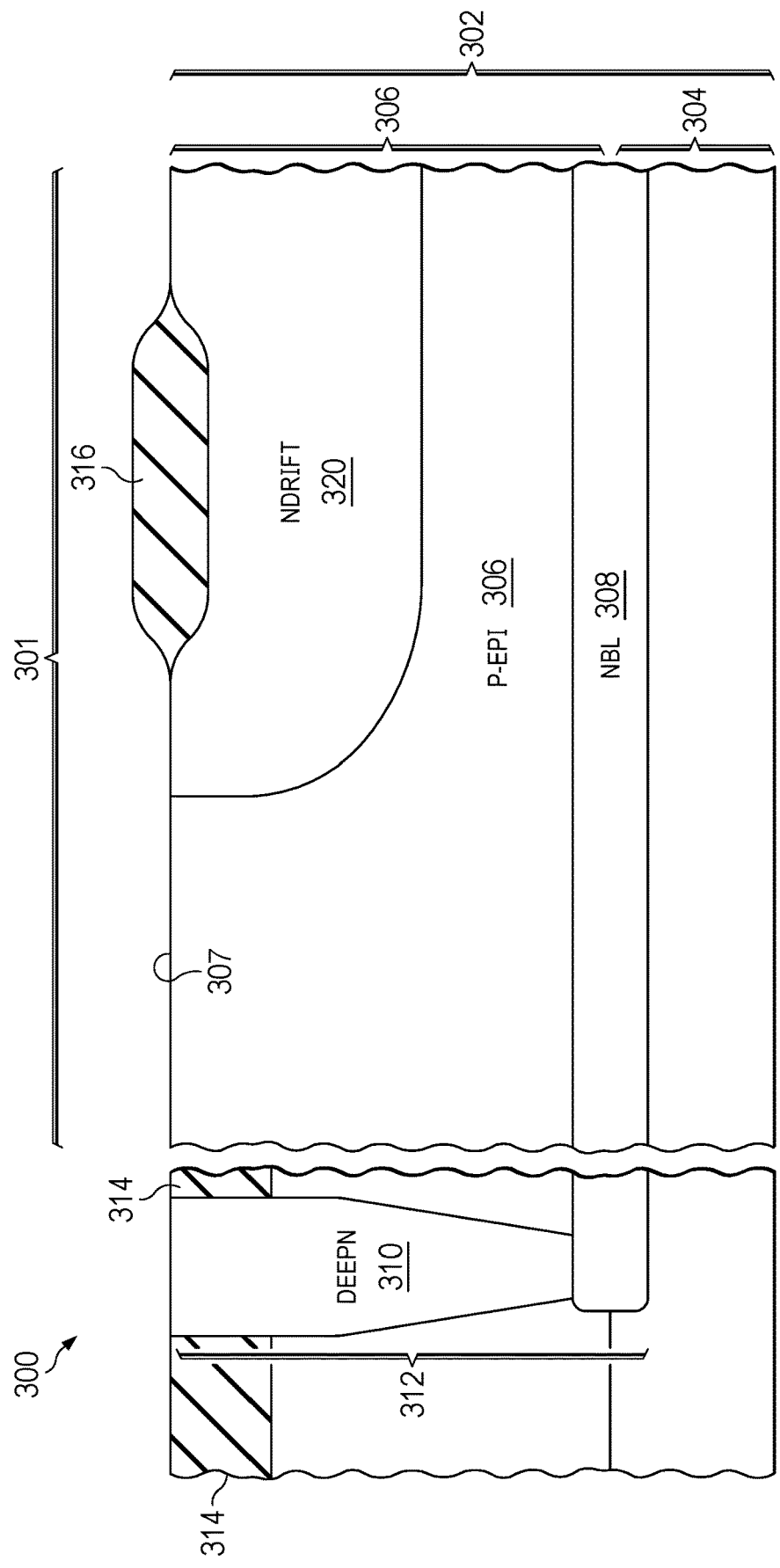

FIG. 3C depicts the integrated circuit 300 after a next stage of fabrication of the FET 301. A drift mask (not shown) is deposited and patterned to expose regions of the semiconductor substrate 302 over a planned drift region. An N-type dopant, which may be phosphorus, arsenic, etc., is implanted into the semiconductor substrate 302 using one or more implantation processes. In one implementation, an anneal process may be used to diffuse the dopant to form the N-type drift region 320.

Figure 3D:
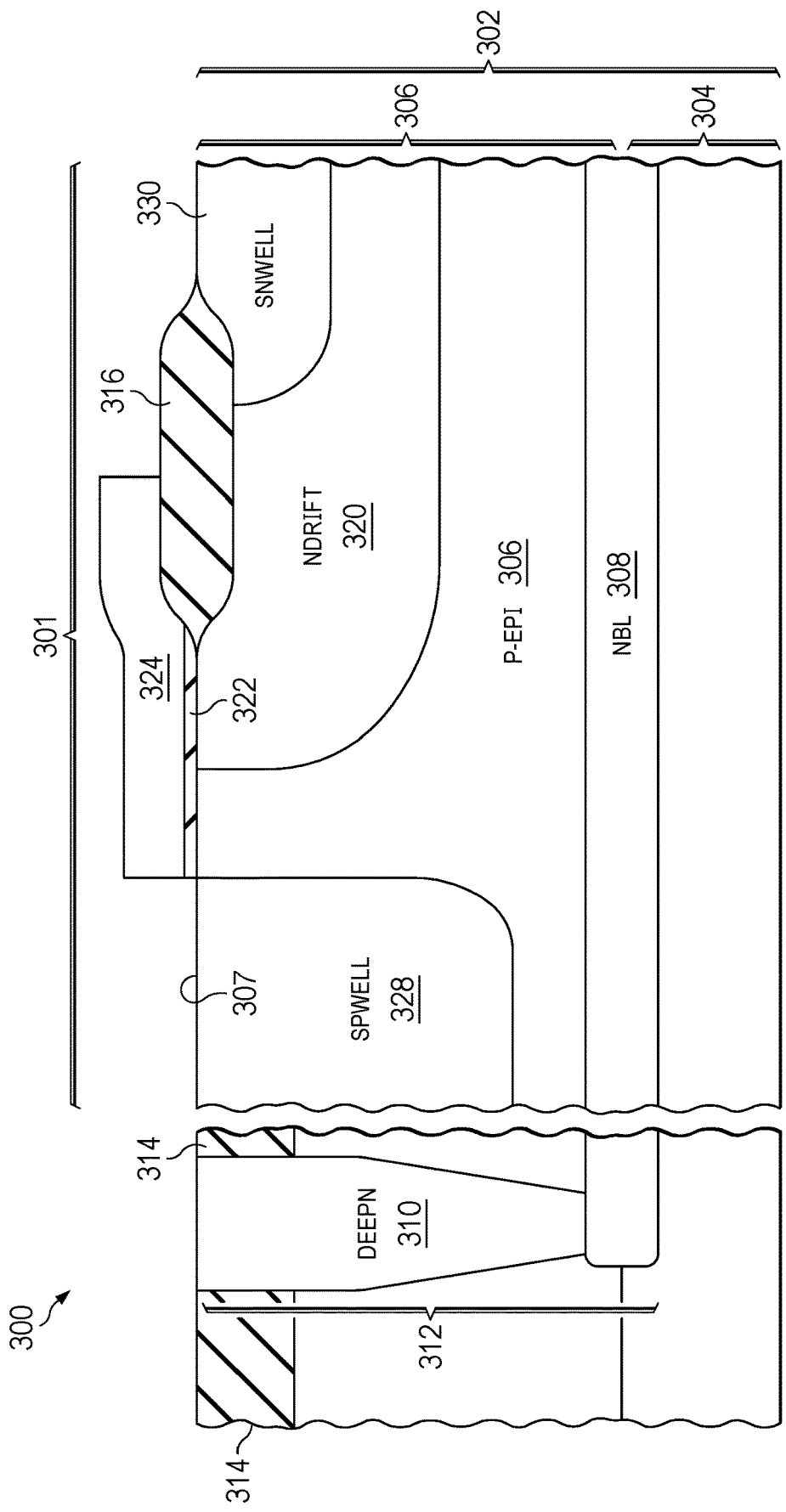

FIG. 3D depicts the integrated circuit 300 after formation of several wells and a gate 324. In one implementation an SP mask (not shown) may be deposited and patterned to expose regions of the semiconductor substrate 302 over a planned shallow P-type well (SPWELL) region. A P-type dopant may be implanted into the semiconductor substrate 302, forming the SPWELL region 328. After removal of the SP mask, an optional shallow N-type well (SNWELL) region may be formed. If desired, an SN mask (not shown) may be deposited and patterned to expose regions of the semiconductor substrate 302 over a planned shallow N-type well (SNWELL) region, followed by implantation of an N-type dopant to form the SNWELL region 330. After removal of the SN mask, if used, a thin gate oxide 322 may be thermally grown or deposited over the surface of the semiconductor substrate 302. In one implementation, a polysilicon layer (not shown) may be deposited over the gate oxide 322. A gate mask (not shown) is deposited and patterned to expose regions of the polysilicon layer that will not be included in the gate and an etch process is used to remove the exposed polysilicon to form gate 324. In other implementations, the gate 324 may be formed of different materials or by another process, which may be conventional or developed in the future, e.g., metal gates.

Figure 3E:
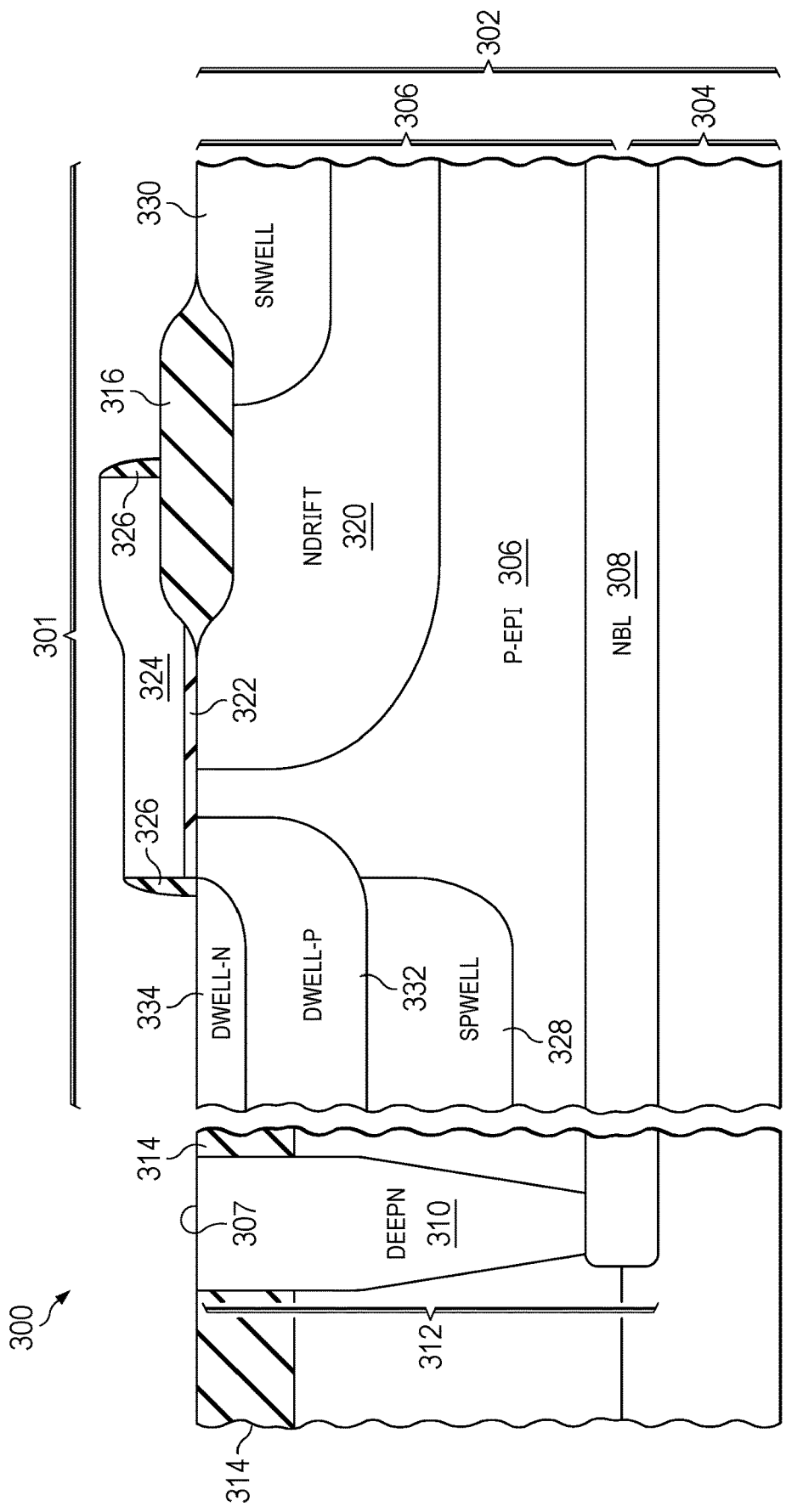

FIG. 3E depicts the integrated circuit 300 after formation of a number of additional wells for the FET 301 within the isolation tank 312. A DW mask (not shown) may be deposited and patterned to exposed regions of the substrate over a planned diffused well region. In one implementation, both an N-type dopant, e.g., phosphorus, and a P-type dopant, e.g., boron, are implanted through the DW mask. During an anneal to diffuse the N-type and P-type dopants, the P-type dopant may diffuse farther than the N-type dopant to form a P-type diffused well (DWELL-P) 332 and an N-type diffused well (DWELL-N) 334. In one implementation, the DWELL-P 332 and the DWELL-N 334 may be formed prior to the formation of the gate. In one implementation, the DWELL-P 332 and the DWELL-N 334 may be formed after the formation of the gate, but prior to the formation of sidewall spacers 326.

Figure 3F:
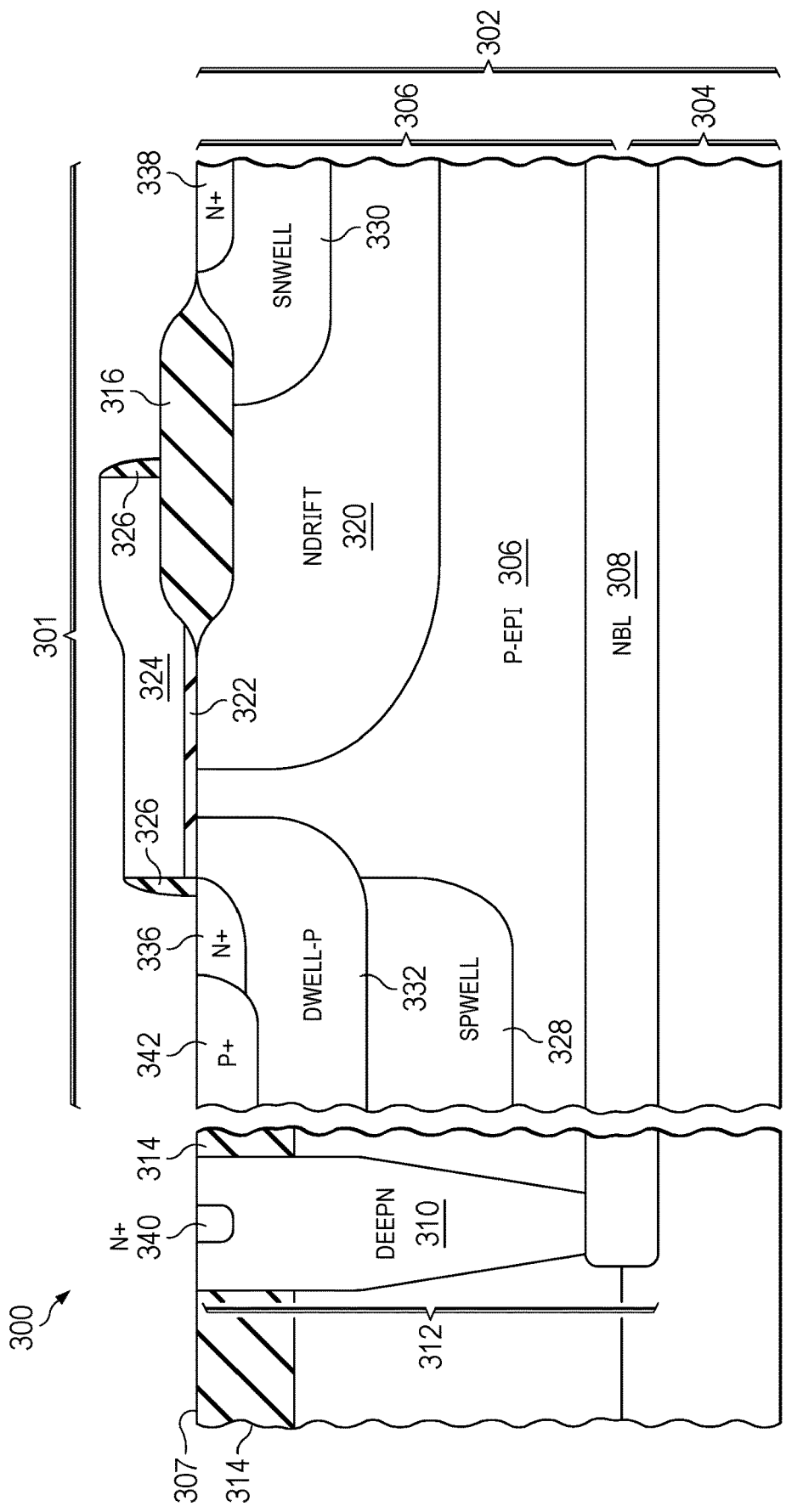

FIG. 3F depicts the integrated circuit 300 after formation of the contact regions in the FET 301 and in the isolation tank 312. An NSD mask (not shown) may be deposited and patterned to expose the semiconductor substrate 302 over planned N-type contact regions. An N-type dopant, which may be phosphorus, may be implanted using the NSD mask to form a source region 336, which may include the doping from the DWELL-N 334, a drain region 338, and an isolation contact 340. After removal of the NSD mask, a PSD mask may be deposited and patterned to expose the semiconductor substrate 302 over planned P-type contact regions. A P-type dopant, which may be boron, may be implanted using the PSD mask to form a backgate contact region 342, which provides a contact to the underlying P-type regions.

Returning to FIG. 2, the method continues with configuring the first source to receive a first potential with respect to the first buried layer (230) and with configuring the second source to receive a difference second potential with respect to the second buried layer (235). Configuring the first source to receive the first potential can include forming a breakdown protection circuit having a protection input. As illustrated in FIGS. 1A through 1F, the breakdown protection circuit can take a number of forms, including the conductive path 101 (FIG. 1A), the conductive path 107 (FIG. 1B), the conductive path 109 (FIG. 1C), the breakdown protection circuit 110 (FIG. 1D), the breakdown protection circuit 118 (FIG. 1E), and the source pull-down circuit 120 (FIG. 1F). Configuring the second source to receive a difference second potential can include coupling the second source to a ground node, either directly or through additional FETs.

Figure 3G:
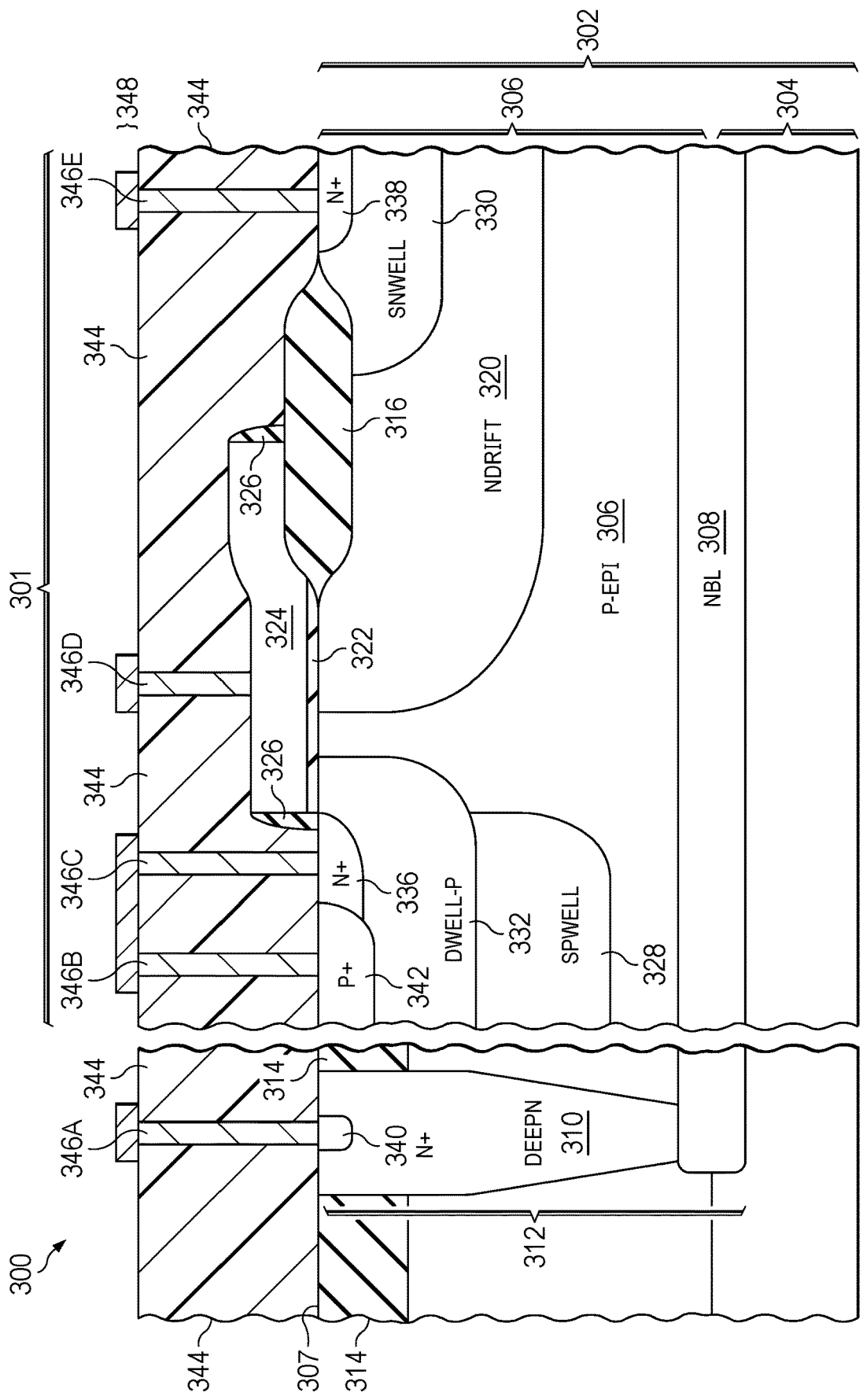

FIG. 3G depicts the integrated circuit 300 after a first metallization layer has been formed over the FET 301. In one implementation, a pre-metal dielectric 344, which may be an oxide, may be deposited on the IC 300. In one implementation, the IC 300 may have undergone silicidation of the contact regions prior to deposition of the pre-metal dielectric 344. Vias 346 may be formed through the pre-metal dielectric 344. In one example implementation shown in FIG. 3G, an isolation via 346A extends to the isolation contact 340; a backgate via 346B extends to the backgate contact region 342; a source via 346C extends to the source region 336; a gate via 346D extends to the gate 324; and a drain via 346E extends to the drain region 338. A first metallization layer 348, which may be aluminum, is deposited and patterned to begin providing connections within IC 300 to other devices on the wafer and to external connections (not shown). In one implementation, the first metallization layer 348 may be copper that is formed using a Damascene process. As shown in FIG. 3G, the backgate contact region 342 and the source region 336 may be coupled together in the first metallization layer 348, as well as in a silicide when present. The ultimate connection for each of the contact regions, e.g., gate 324, source region 336, drain region 338, isolation contact 340, and backgate contact region 342, is determined by the purpose of the FET 301 within the IC 300 and the breakdown protection circuit used.

Several implementations of the breakdown protection circuit for configuring the first source to receive the first potential with respect to the first buried layer have been disclosed in FIGS. 1A through 1F. In the example implementations shown in the IC 100A (FIG. 1A), 100B (FIG. 1B), 100C (FIG. 1C), the breakdown protection circuit may include the isolation tank IT1 (FIG. 1A), which may be coupled to an circuit signal node ISO, which may itself be coupled to a low voltage power source, e.g., in the range of about 1 V to about 3 V. In the example implementation shown in the IC 100D (FIG. 1D), the breakdown protection circuit may include the isolation tank IT1 (FIG. 1D), an inversion circuit such as the inverter 112 (FIG. 1D) and a control node such as the control node CNTL. The control node CNTL may be coupled to a control circuit (not shown) that controls the gate of the power FET M0. In each of IC 100A (FIG. 1A), 100B (FIG. 1B), 100C (FIG. 1C), and 100D (FIG. 1D), the second source is within isolation tank IT2, which is coupled to a ground node, so that the second potential will be different from the first potential.

In the example implementation shown in IC 100E (FIG. 1E), both the first FET M1 and the second FET M2 are contained within the isolation tank IT1, and the isolation tank IT1 is coupled to the ground node. However, in this implementation, the voltage at the first source is modulated by the breakdown protection circuit 118 (FIG. 1E), which may be implemented in various circuit elements, and which may be coupled to the control node CNTL on input 117. In one implementation, when the control node CNTL has a high value, the output 119 may have a high resistance, so that the source node S1 (FIG. 1E) is unconstrained by the breakdown protection circuit 118, and when the control node CNTL has a low value, the output 119 may provide a low output value, or may actively pull the source node S1 down to the ground node.

In the example implementation shown in IC 100F (FIG. 1F), both the first FET M1 and the second FET M2 are again contained within the isolation tank IT1, which is coupled to the ground node. The source pull-down circuit 120 may be coupled to the control node CNTL (FIG. 1F) at the input 117 and to the source node S1 (FIG. 1F) at the output 119. In one implementation, the source pull-down circuit 120 includes a logical non-inversion circuit such as source pull-down circuit 120 (FIG. 1F), which includes an inverter 122 and a pull-down transistor such as pull-down FET MPD (FIG. 1F). In one implementation, the source node S1 (FIG. 1F) may be coupled to a drain of the pull-down FET MPD (FIG. 1F), while a source of the pull-down FET MPD (FIG. 1F) is coupled to a ground node. The control node CNTL may be coupled to the input 117 (FIG. 1F) of the source pull-down circuit 120 (FIG. 1F) and a gate of the pull-down FET MPD (FIG. 1F) may be coupled to the output 124 (FIG. 1F) of the inverter 122 (FIG. 1F). The control node CNTL may be coupled to a control circuit (not shown) that controls the gate of the power FET M0.

Applicant has disclosed an IC that includes a power FET and a current sense circuit that includes current sense FETs. Applicant has described a breakdown voltage of a parasitic BJT within the current sense circuit that may be triggered during operation of the IC and has also provided several example implementations of a breakdown protection circuit to prevent the breakdown voltage from occurring during operation. While examples of the breakdown protection circuit may contain different elements, all of the examples prevent the isolation voltage of the isolation structure from dropping below the source voltage of the source of a first current sense FET in the current sense circuit.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the example implementations described herein can be practiced with various modifications and alterations within the spirit and scope of the claims appended below.

What is claimed is:

1. An integrated circuit comprising:
a first field effect transistor (FET) formed in or over a semiconductor substrate and having a first source, a first drain and a first buried layer all having a first conductivity type, and a first gate between the first source and the first drain; and
a second FET formed in or over the semiconductor substrate and having a second source, a second drain and a second buried layer all having the first conductivity type, and a second gate between the second source and the second drain, the first and second FETs being configured to selectively conduct a current between a first circuit node and a second circuit node;
wherein a first potential between the first source and first buried layer is configurable independently from a second potential between the second source and the second buried layer.

2. The integrated circuit of claim 1, wherein the first buried layer and the second buried layer are portions of a same buried layer.

3. The integrated circuit of claim 1, wherein the first buried layer touches a well having the first conductivity type that extends to a top surface of the semiconductor substrate.

4. The integrated circuit of claim 1, further comprising a third FET formed in or over the semiconductor substrate and having a third source, a third drain and a third buried layer all having the first conductivity type, and a third gate between the third source and the third drain, the third FET being configured to selectively conduct a current between the first circuit node and a third circuit node.

5. The integrated circuit of claim 4, wherein the first, second and third buried layers are portions of a same buried layer.

6. The integrated circuit of claim 1, wherein a current path between the first source and a circuit power node is configured to have a high resistance in the event that the first FET is on, and a low resistance in the event that the first FET is off.

7. The integrated circuit of claim 4, wherein each of the first, second and third FETs is a laterally diffused metal oxide semiconductor (LDMOS) FET.

8. The integrated circuit of claim 1, further comprising a third FET formed in or over the semiconductor substrate and having a third source, a third drain, a third gate between the third source and the third drain, and a third buried layer all having the first conductivity type, the third drain electrically connected to the second drain, and the third source electrically connected to the second source and the third gate.

9. The integrated circuit of claim 1, wherein a substrate isolation structure is located between the first and second FETs.

10. The integrated circuit of claim 1, wherein the first conductivity type is N-type.

11. A method of forming an integrated circuit comprising:
forming a first field effect transistor (FET) in or over a semiconductor substrate and having a first source, a first drain and a first buried layer all having a first conductivity type, and a first gate between the first source and the first drain; and
forming a second FET in or over the semiconductor substrate and having a second source, a second drain and a second buried layer all having the first conductivity type, and a second gate between the second source and the second drain, the first and second FETs being configured to selectively conduct a current between a first circuit node and a second circuit node; and
configuring the first source to receive a first potential with respect to the first buried layer and configuring the second source to receive a different second potential with respect to the second buried layer.

12. The method of claim 11, wherein the first buried layer and the second buried layer are portions of a same buried layer.

13. The method of claim 11, further comprising forming a well having the first conductivity type that extends from a top surface of the semiconductor substrate to the first buried layer.

14. The method of claim 11, further comprising forming a third FET in or over the semiconductor substrate and having a third source, a third drain and a third buried layer all having the first conductivity type, and a third gate between the third source and the third drain, the third FET being configured to selectively conduct a current between the first circuit node and a third circuit node.

15. The method of claim 14, wherein the first, second and third buried layers are portions of a same buried layer.

16. The method of claim 11, further comprising configuring a current path between the first source and a circuit power node to have a high resistance in the event that the first FET is configured to have a low resistance between the first source and the first drain, and a low resistance in the event that the first FET is configured to have a high resistance between the first source and the first drain.

17. The method of claim 14, wherein each of the first, second and third FETs is a laterally diffused metal oxide semiconductor (LDMOS) FET.

18. The method of claim 11, further comprising forming a third FET in or over the semiconductor substrate and having a third source, a third drain, a third gate between the third source and the third drain, and a third buried layer all having the first conductivity type, the third drain electrically connected to the second drain, and the third source electrically connected to the second source and the third gate.

19. The method of claim 11, wherein a substrate isolation structure is located between the first and second FETs.

20. The method of claim 11, wherein the first conductivity type is N type.

* * * * *